United States Patent
Naya et al.

(10) Patent No.: US 7,027,888 B2
(45) Date of Patent: Apr. 11, 2006

(54) SEMICONDUCTOR MANUFACTURING APPARATUS

(75) Inventors: Hidemitsu Naya, Tokyo (JP); Koji Hashimoto, Tokyo (JP); Masamichi Kawano, Ibaraki (JP); Rikio Tomiyoshi, Ibaraki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/186,455

(22) Filed: Jul. 21, 2005

(65) Prior Publication Data

US 2005/0270857 A1    Dec. 8, 2005

Related U.S. Application Data

(63) Continuation of application No. 10/625,887, filed on Jul. 23, 2003, now Pat. No. 6,941,186.

(30) Foreign Application Priority Data

Aug. 22, 2002  (JP)  .............................. 2002-241294

(51) Int. Cl.
    *G06F 19/00* (2006.01)

(52) U.S. Cl. ...................... 700/121; 710/307; 711/162; 714/6

(58) Field of Classification Search ................ 700/115, 700/117, 121; 709/245, 251; 710/307, 315; 711/113, 162; 714/6
See application file for complete search history.

(56) References Cited

U.S. PATENT DOCUMENTS

| | | | | |
|---|---|---|---|---|
| 5,696,689 A | * | 12/1997 | Okumura et al. | 700/121 |
| 5,838,566 A | * | 11/1998 | Conboy et al. | 700/115 |
| 5,884,055 A | * | 3/1999 | Tung et al. | 710/307 |
| 5,890,207 A | * | 3/1999 | Sne et al. | 711/113 |
| 5,890,219 A | * | 3/1999 | Scaringella et al. | 711/162 |
| 6,788,990 B1 | * | 9/2004 | Yanaru et al. | 700/121 |

FOREIGN PATENT DOCUMENTS

| | | |
|---|---|---|
| JP | 63-208215 | 8/1988 |
| JP | 07-307262 | 11/1995 |
| JP | 09-153441 | 6/1997 |
| JP | 11-085326 | 3/1999 |
| JP | 2000-164666 | 6/2000 |
| JP | 2000-164667 | 6/2000 |
| JP | 2002-132986 | 5/2002 |
| WO | WO 00/17769 | 3/2000 |
| WO | WO 00/18049 | 3/2000 |
| WO | WO 00/29954 | 5/2000 |

* cited by examiner

*Primary Examiner*—Leo Picard
*Assistant Examiner*—Douglas S. Lee
(74) *Attorney, Agent, or Firm*—Hogan & Hartson, L.L.P.

(57) ABSTRACT

A semiconductor manufacturing apparatus includes: a calculation unit having at least one computer for processing semiconductor design information; a control unit for controlling radiation of an electron in accordance with a processing result of the semiconductor design information; a writing unit for radiating an electron in accordance with instructions of the control unit; and at least one storage device. The semiconductor manufacturing apparatus permits a communication between the storage device, the calculation unit, the control unit, and the writing unit. The semiconductor manufacturing apparatus further includes a communication pass through which the storage device can be controlled.

2 Claims, 21 Drawing Sheets

SEMICONDUCTOR MANUFACTURING APPARATUS

This is a continuation of application Ser. No. 10/625,887 filed Jul. 23, 2003 now U.S. Pat. No. 6,941,186, which application is hereby incorporated by reference in its entirety.

FIELD OF THE INVENTION

The present invention relates to a processing apparatus having a network to be interconnected with a storage device, and particularly relates to an inspection apparatus and a manufacturing apparatus for semiconductors or semiconductor masks in relation to manufacture of semiconductors, and a system utilizing these inspection apparatus and the manufacturing apparatus.

BACKGROUND OF THE INVENTION

In order to interconnect interior devices of an apparatus or to interconnect different apparatus, as a conventional construction, Japanese Laid-open Patent Application Nos. 2000-164667 and 2000-164666 disclose to interconnect them through a standard LAN (local area network), such as Ethernet (registered trademark).

As another known example, Japanese Laid-open Patent Application No. 9-153441 divides a LAN into a plurality of segments and installs a processing station between the divided segments to copy data.

Japanese Laid-open Patent Application No. 11-85326 discloses a system having a plurality of computers interconnected through a network, and all the design information is previously transferred from the client to a plurality of servers.

Further, Japanese Laid-open Patent Application No. 2002-132986 discloses a system which interconnects clients and a manufacturing apparatus using the Internet.

An electron beam lithography apparatus is disclosed in Japanese Laid-open Patent Application No. 63-208215, wherein a plurality of electron beam lithography systems are respectively connected with a buffer memory for storing writing data, and a control computer controls these plurality of buffer memories such that desired image data is stored in each buffer memory from the writing data storing unit, thereby continuously writing different patterns within a writing area of each electron beam lithography system. Japanese laid-open Patent Application No. 7-307262 discloses an electron beam lithography apparatus which draws desired patterns by a charged electron beam with the aid of apertures and the like based on CAD data as semiconductor design information.

As to conventional storage area networks, WO00/18049 and WO00/17769 disclose a link through a fiber channel. WO00/29954 discloses a network through an optical fiber. Also, a link through Ethernet (registered trademark), such as iSCSI, iFCP, and FCIP, and a link through a switched bus or a shared bus are known. The storage area network is a general term of the network for linking storage devices without consideration of a kind of communication device. The link of storage devices through a serial bus as defined in IEEE1394 and the link of storage devices through a switched bus as defined by InfiniBand (registered trademark) are also included in the storage area network.

Mask layout data as a kind of semiconductor design information is prepared by a logic design maker. The mask layout data is then processed by the semiconductor design apparatus to provide a mask (reticle). The mask layout data is stored in a local storage device of the logic design maker. If the logic design maker has to supply the mask layout data, for example, to a mask shop which possesses a semiconductor manufacturing apparatus, the mask layout data should be copied in a storage medium such as a magnetic tape. The mask shop then receives the storage medium and copies the contents of the storage medium into a local storage device of the mask shop.

However, the aforementioned conventional technologies do not consider the kind of data flowing through the network. Because two kinds of data, i.e. a large volume of CAD data representing design information of semiconductors and message data representing control commands for controlling and linking a variety of devices, are transferred through the same network, the traffic inevitably increases, degrading the performance of the network, which in turn adversely affects the overall performance of the system. In other words, the conventional networks have a drawback in that the throughput of the network changes according to the frequency of issuing the control command, the frequency of generating a response to the command, and the transmission/reception of a large volume of data, thereby degrading the overall performance of the apparatus. As the advance of the micro-fabrication technology in particular, the volume of the design data of semiconductors and masks and the volume of the image data as the inspection result drastically increase. As a result, the band of the network is occupied by simply communicating these data. This adversely affects the transmission and reception of the message data.

As a prior art technology to solve this problem, all the design information is previously transferred to a plurality of computers for processing. However, because the volume of data transfer increases as the number of computers linked, extreme amount of traffic occurs at time of the data transfer. Further, each of the plurality of computers for receiving the design information must provide a storage device for storing a large volume of design information.

In this prior art technology, CAD data that is the basis of the design information of semiconductors is converted into a writing data format originated from the electron beam lithography apparatus, and the pattern data indicated by this writing data format is further processed such as by conversion and correction in real time operation, thereby radiating an electron beam. These processes are sequentially and continuously executed. Therefore, the conversion process and the correction process are carried out independently before executing the writing, and it is impossible to temporarily store the processing results. As a result, it is very difficult to predict the time required for electron beam radiation and the accuracy of writing. Because processing results can not be stored in mid-course of the operation, it is very difficult to suspend and restart the process. Even in the case of processing the same design data, the conversion process and the correction process must be repeated from the beginning.

In these prior art technologies, data is mostly stored in a file system which realizes data having arbitrary length as assemblies of a plurality of blocks having fixed length. This file system has a control list indicating the relation of a plurality of fixed length blocks associated with the arbitrary data. However, a large volume of fixed length blocks are required against such a large volume of data, which leads to a large volume of the control list. This decreases an area in which the storage device actually stores data, and also adversely deteriorates the throughput because of the retrieval process of the control list for accessing the data.

The fixed length blocks are ineffectively arranged in the storage device as the result of preparation, deletion or transfer of the data, which also deteriorates the throughput.

Of the above prior art technologies, a technique is suggested wherein a LAN is divided into a plurality of segments and processing stations are installed between the segments to perform copying of the data for the purpose of alleviating the traffic. However, because the processing stations copy data between the segments, the processing stations per se become a bottleneck of the overall performance of the system. Further, because each of the storage devices interconnected to individual segments copies the same data, the consistency management of the copied data becomes complicated, which results in difficulty in system operation. For example, even if the semiconductor inspection apparatus and the semiconductor manufacturing apparatus are interconnected through the network, data must be copied through the network in order to transfer the data between these apparatus. This results in a crowd of the network and deteriorated throughput. Even in the case where a plurality of semiconductor inspection apparatus and a plurality of semiconductor manufacturing apparatus are interconnected through the network and processing is carried out in a parallel manner, data must be copied through the network. This also results in a crowd of the network and difficulty in the system organization due to management of data exchange. Further, in most cases, it is impossible to interconnect a new storage device through the network without stopping the operation of the system. In other words, when the storage device is filled up, it is very difficult to extend the storage capacity.

SUMMARY OF THE INVENTION

In view of the above, the purpose of the present invention is to improve the throughput of the entire apparatus and to unify the management of various data.

According to the present invention, communication of control commands and the like can be separated from a network, through which a large volume of information such as semiconductor production information is communicated or through which a storage device is interconnected. In other words, there is provided a network for communicating a large volume of information and for interconnecting a storage device for storing data.

Further, necessary processing results of at least one of a calculation unit, a control unit, and a writing unit are stored and referred to. In other words, there is provided an interface to a network through which the storage device is interconnected at least with the calculation unit, the control unit, and the writing unit.

Further, a reference sequence to processing results that are stored in the storage device corresponds to movement of the stage and a locus of electron beam radiation. In other words, writing area information and pattern information presented in the writing area information are provided, and they are stored in a storage device in a manner conforming to the movement of the stage and the locus of the electron beam lithography.

Further, a storage device is not interconnected directly with a particular computer. In other words, with the provision of a network for arbitrary interconnecting a computer and a storage device, a plurality of computers share the storage device.

DESCRIPTION OF PREFERRED EMBODIMENTS

Figure 1:
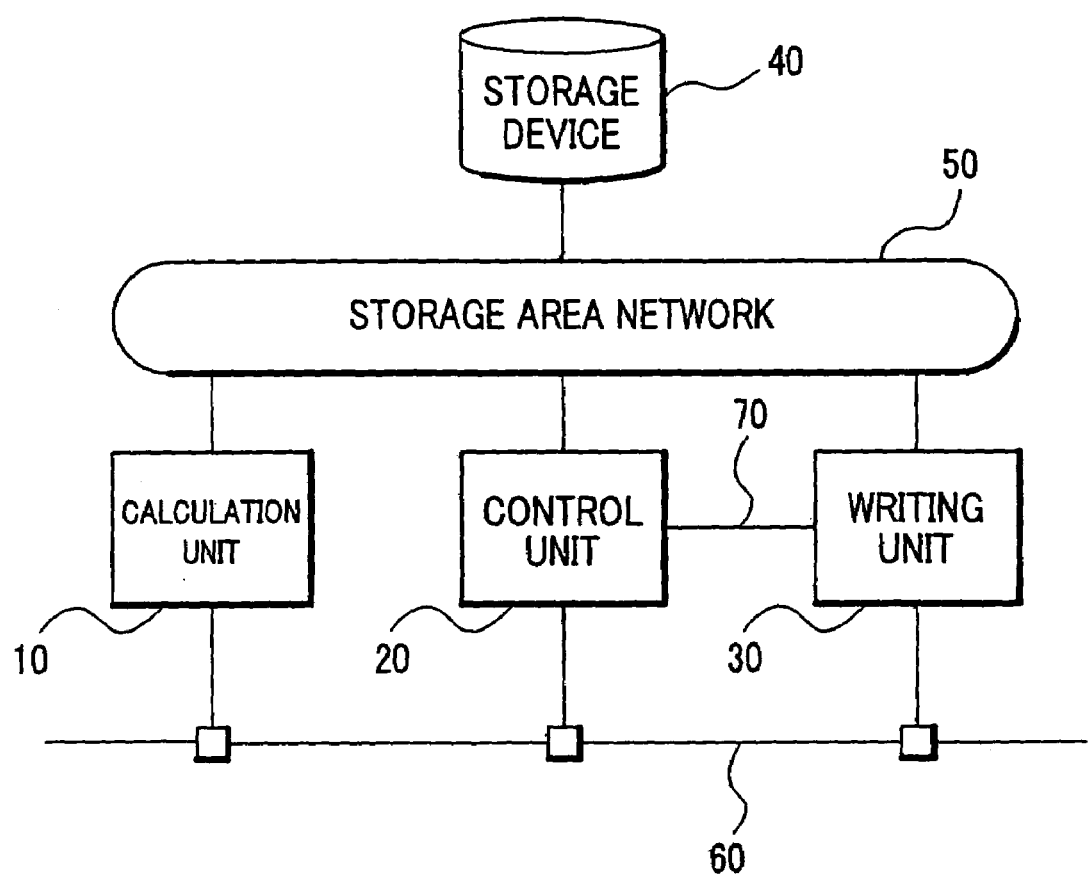
FIG. 1 is a block diagram illustrating a basic configuration of a semiconductor manufacturing apparatus according to the present invention.

One preferred embodiment of the present invention is shown in FIG. 1.

A calculation unit 10 includes at least one computer which processes semiconductor design information (semiconductor production information). In general, the semiconductor design information is CAD data such as GDSII to be described as pattern information. The semiconductor design information also includes cell library information, logic design information, and circuit information that are depending upon the semiconductor process. The calculation unit 10 executes a pattern calculation process and a correction process as well as executes a conversion into a data format that is originated from an electron beam lithography apparatus and that can be inputted by the control unit 20. The control unit 20 inputs the own data format and executes a conversion into a data that can be inputted by the writing unit 30. The control unit 20 also executes a correction process against the proximity effect of electron beam radiation, a follow-up control to follow the position of the stage by which a wafer is moved, and a calibration control for electron beam radiation. The writing unit 30 inputs data that is outputted from the control unit 20, and radiates an electron beam (single-beam or multi-beam) based on this data. The storage device 40 is interconnected with the calculation unit 10, the control unit 20, and the writing unit 30 through a storage area network 50. The storage device 40 stores semiconductor design information and information produced by the calculation unit 10, the control unit 20, and the writing unit 30. A local area network 60 interconnects the calculation unit 10, the control unit 20, and the writing unit 30. A writing data communication path-70 is a communication path interconnecting the control unit 20 and the writing unit 30. With such an interconnection through the storage area network 50, it is possible to store information that is conventionally disposed at the calculation unit 10, the control unit 20, and the writing unit 30, and unlike the conventional system, it is not necessary to refer to the storage device 40 via a specific computer and the local area network 60. This can alleviate the traffic of the local area network 60. Further, in the conventional system, because the storage device 40 is directly interconnected with a specific computer, and in the case of SCSI parallel interface, it is necessary to add the storage device 40 after the computer is stopped. However, according to the configuration of the present invention, because the storage device 40 is not directly interconnected to a specific computer, a storage device 40 can be added to the storage area network 50 when necessary. The storage device 40 indicates a physical storage device, or a virtual storage device or a storage area provided by the physical storage device.

Figure 2:
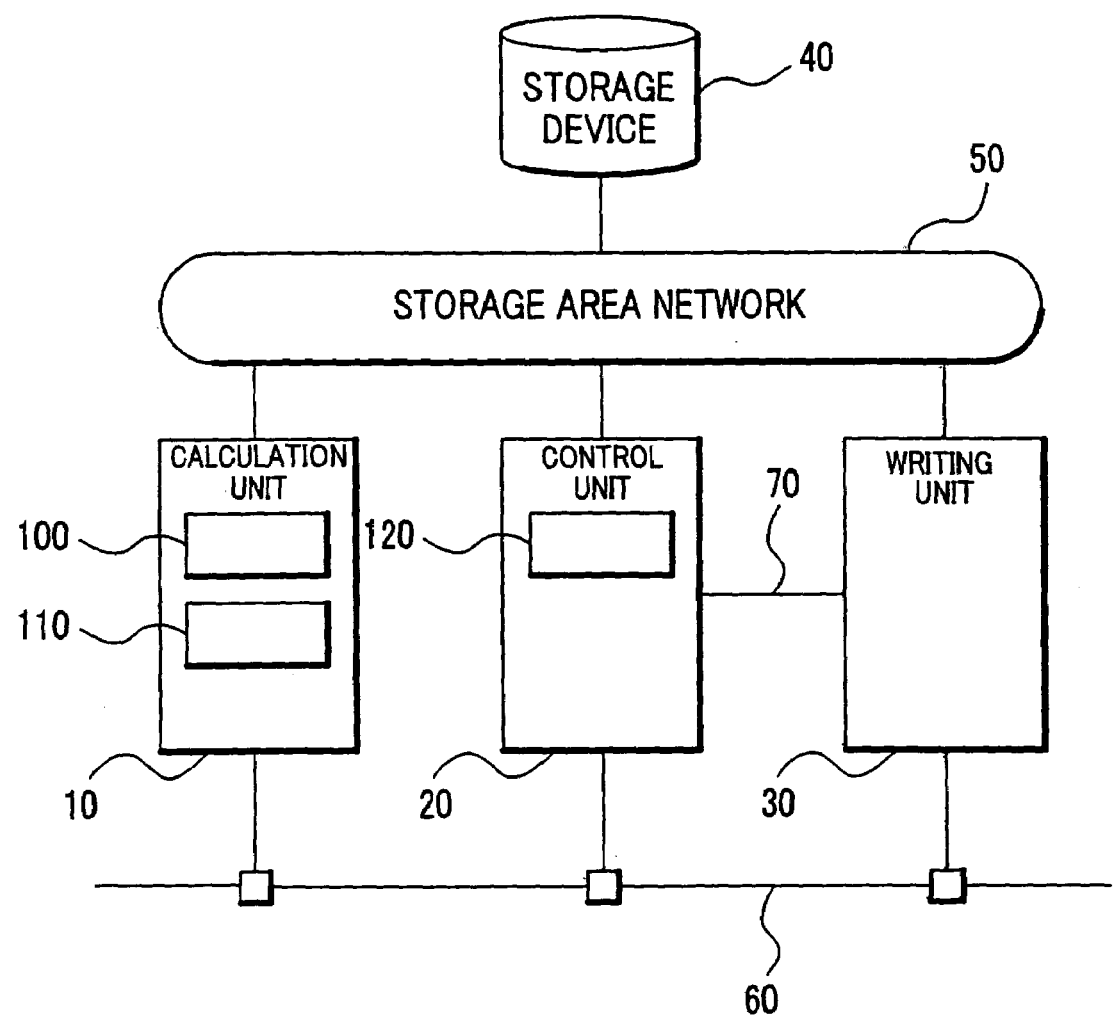
FIG. 2 is a block diagram illustrating one example employing a plurality of computers according to the present invention.

FIG. 2 shows a configuration of the present invention in which each of the calculation unit 10 and the control unit 20 has at least one computer. The calculation unit 10 includes at least one division computer 100 which executes a process for dividing semiconductor production information into arbitrary areas, and at least one conversion computer 110 which processes the semiconductor production information that is divided into arbitrary areas. The control unit 20 includes at least one control computer 120. The division computer 100, the conversion computer 110, and the control computer 120 can access the storage device 40 through the storage area network 50.

Figure 3:
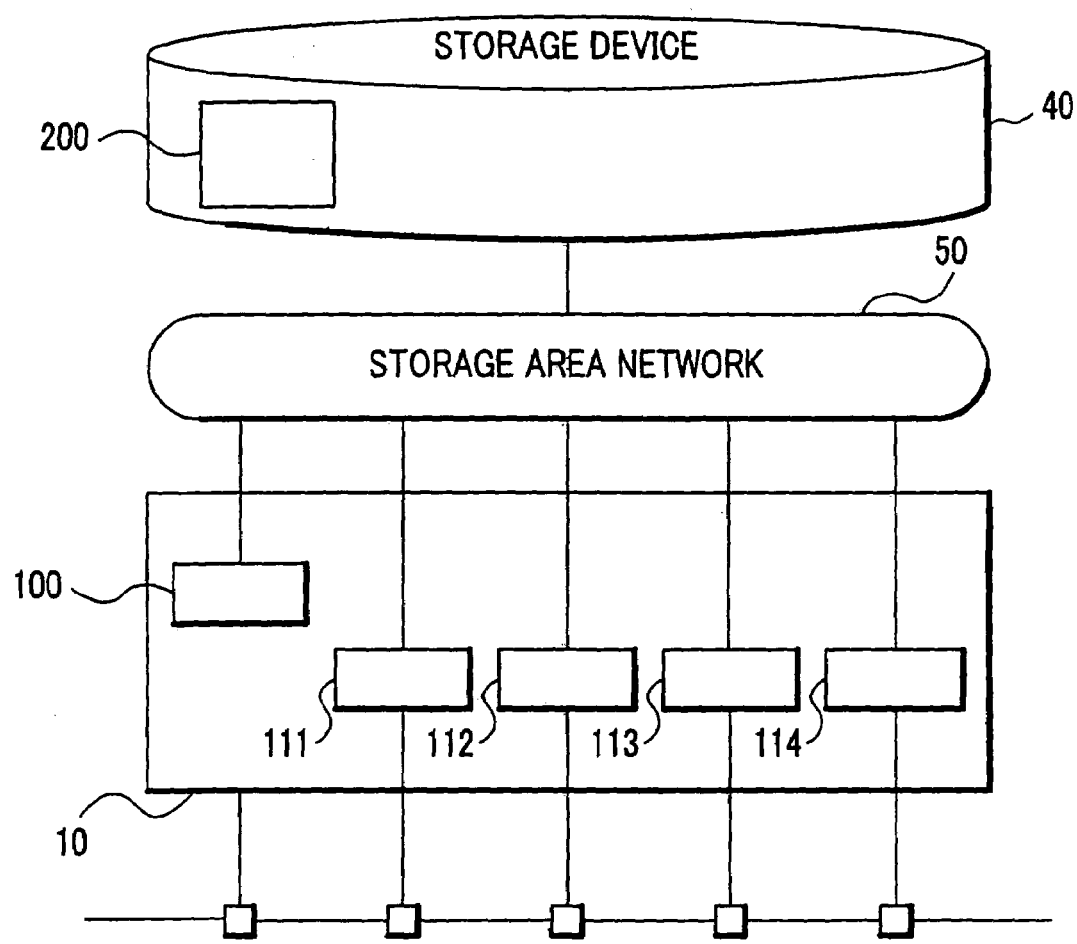
FIG. 3 is a block diagram illustrating a parallel processing configuration of a calculation unit according to the present invention.

FIG. 3 shows an embodiment partly illustrating the calculation unit 10 including the division computer 100 and a plurality of conversion computers 110, the storage device 40, the storage area network 50, and the semiconductor production information 200. In this embodiment, the division computer 100 and the plurality of conversion computers 111, 112, 113, 114 can share the semiconductor production information stored in the storage device 40 through the storage area network 50. In this preferred embodiment, the conversion computer 110 consists of four conversion computers 111, 112, 113, 114, however, the number of conversion computers is not limited to four computers. Because the storage device 40 is not directly interconnected with the aforementioned computers, even if arbitrary numbers of conversion computers are added, they can refer to the storage device 40. This can improve the throughput of the entire apparatus. Further, even if some of the computers cause failure, the other computers can continuously access the storage device 40 because the storage device 40 is not directly interconnected with the faulty computers. Also, it is possible to separate the faulty computers from the storage area network 50 without affecting the other computers.

Figure 4:
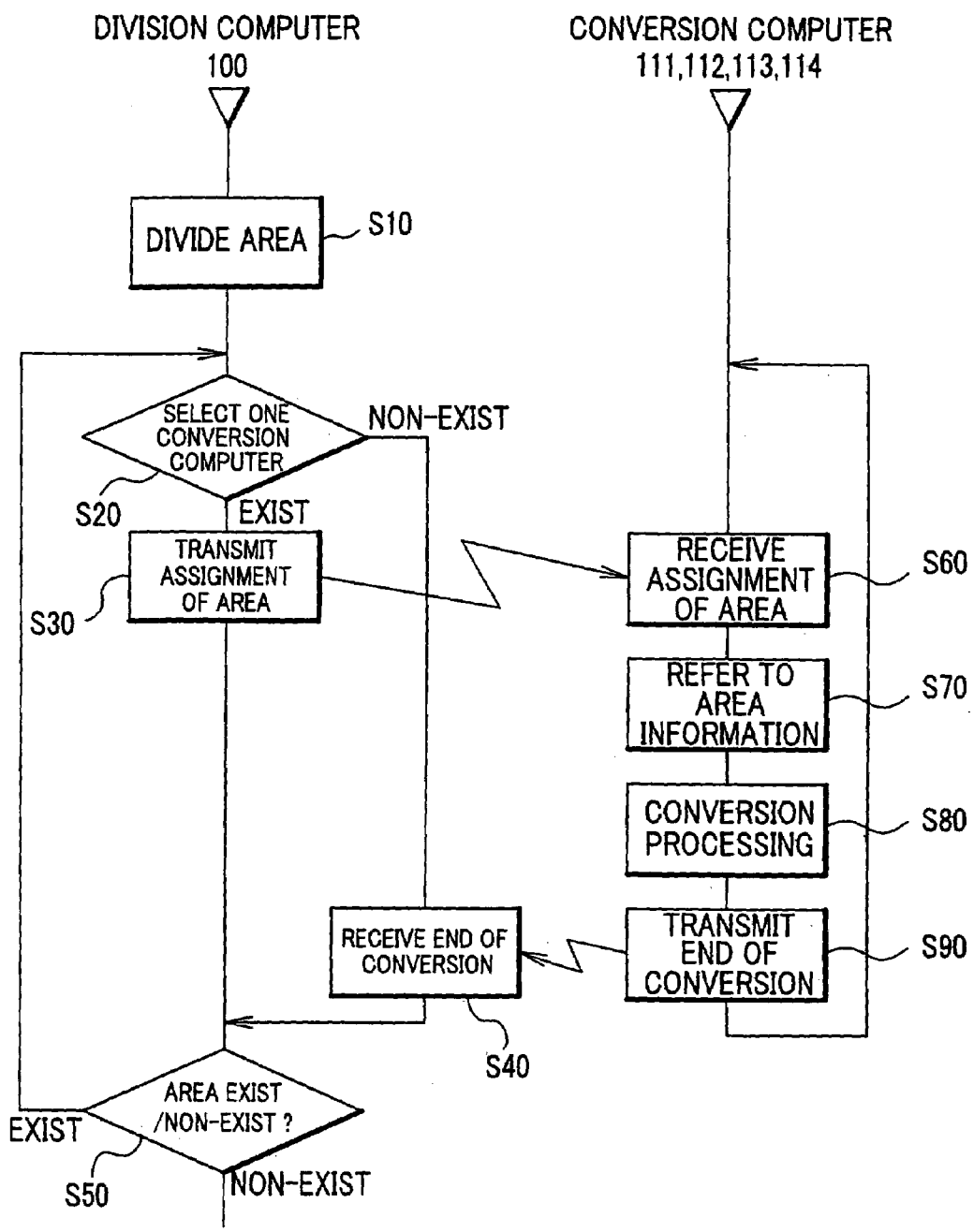
FIG. 4 is a flow chart by which areas shown in FIG. 3 are defined and processed.
Figure 5:
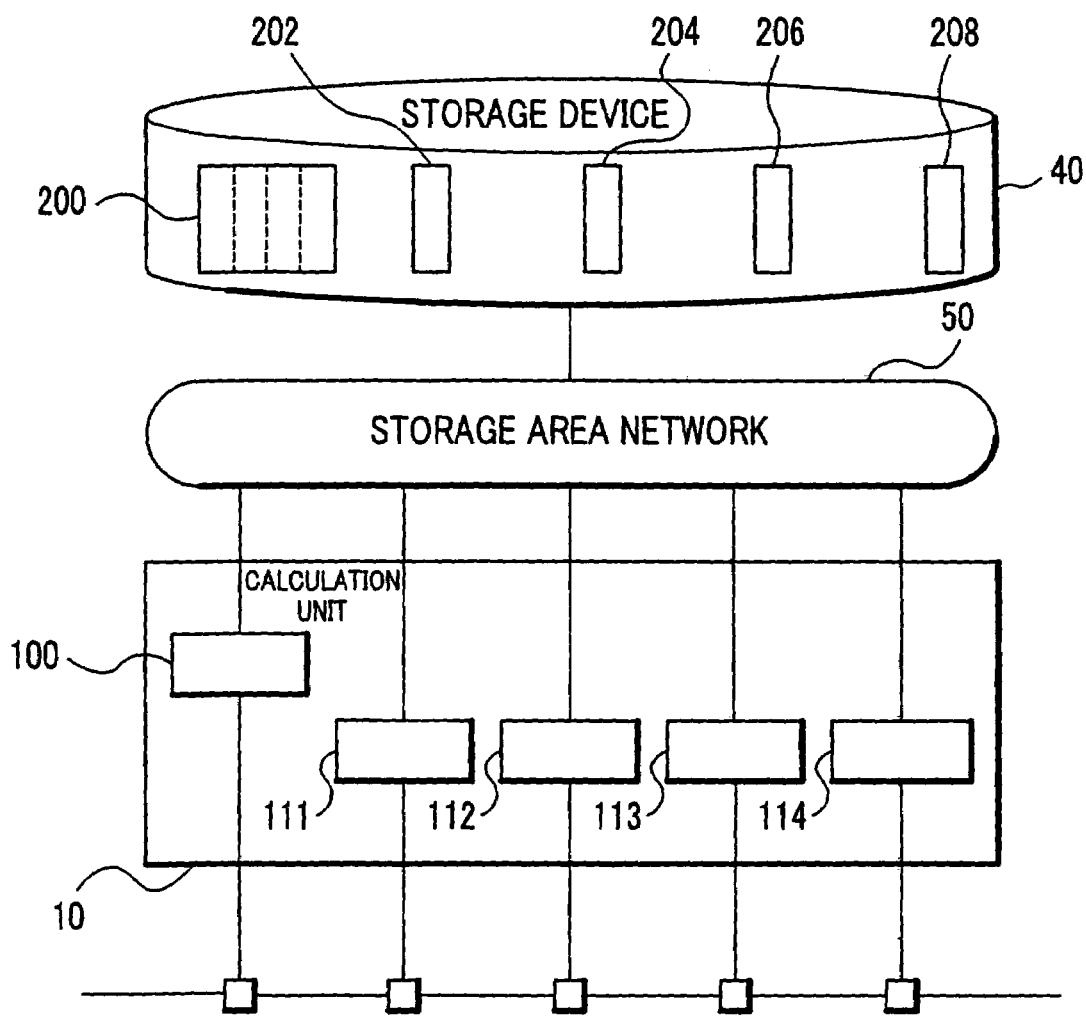
FIG. 5 is a block diagram illustrating a configuration by which area information is divided and stored.

FIG. 4 shows a process flow concerning the embodiment of FIG. 3. The division computer 100 refers to the semiconductor production information 200 stored in the storage device 40 and divides it into arbitrary areas (S10). The division computer 100 selects one of the conversion computers 111, 112, 113, 114 on condition that it can execute the process (S20). The division computer 100 communicates with the selected conversion computer 110 to assign an arbitrary area (S30). After a confirmation whether or not an unprocessed divided area remains (S50), operation is completed if all the areas are processed. If an unprocessed area remains, then operation returns to S20. If there is no conversion computer left which can execute the process, then operation is suspended to stand by for the arrival of an end message from the conversion computers 111, 112, 113, 114 (S40). Meanwhile, the conversion computer 111, 112, 113, 114 receives a command for assigning an arbitrary area (S60). Based on the assignment of the area, the conversion computer 110 refers to the semiconductor production information 200 stored in the storage device 40 (S70) Information referred to is then converted (S80). When the process is completed, the conversion computer 110 transmits the message indicating the end of process to the division computer 100 (S90) FIG. 5 shows one example in which the division computer 100 divides the semiconductor production information 200 into a plurality of areas 202, 204, 206, 208, and stores them in the storage device 40 together with the semiconductor production information 200. In this preferred embodiment, the conversion computer 110 consists of four conversion computers 111, 112, 113, 114, however the number of the conversion computers is not limited to four computers. In this embodiment, the division computer 100 and the plurality of conversion computers 111, 112, 113, 114 can share the semiconductor production information 200 stored in the storage device 40 through the storage area network 50. With this configuration, the amount of information stored in the storage device 40 increases, however, it is possible to avoid contention of access to the semiconductor production information 200. This can improve the performance of the entire apparatus.

Figure 6:
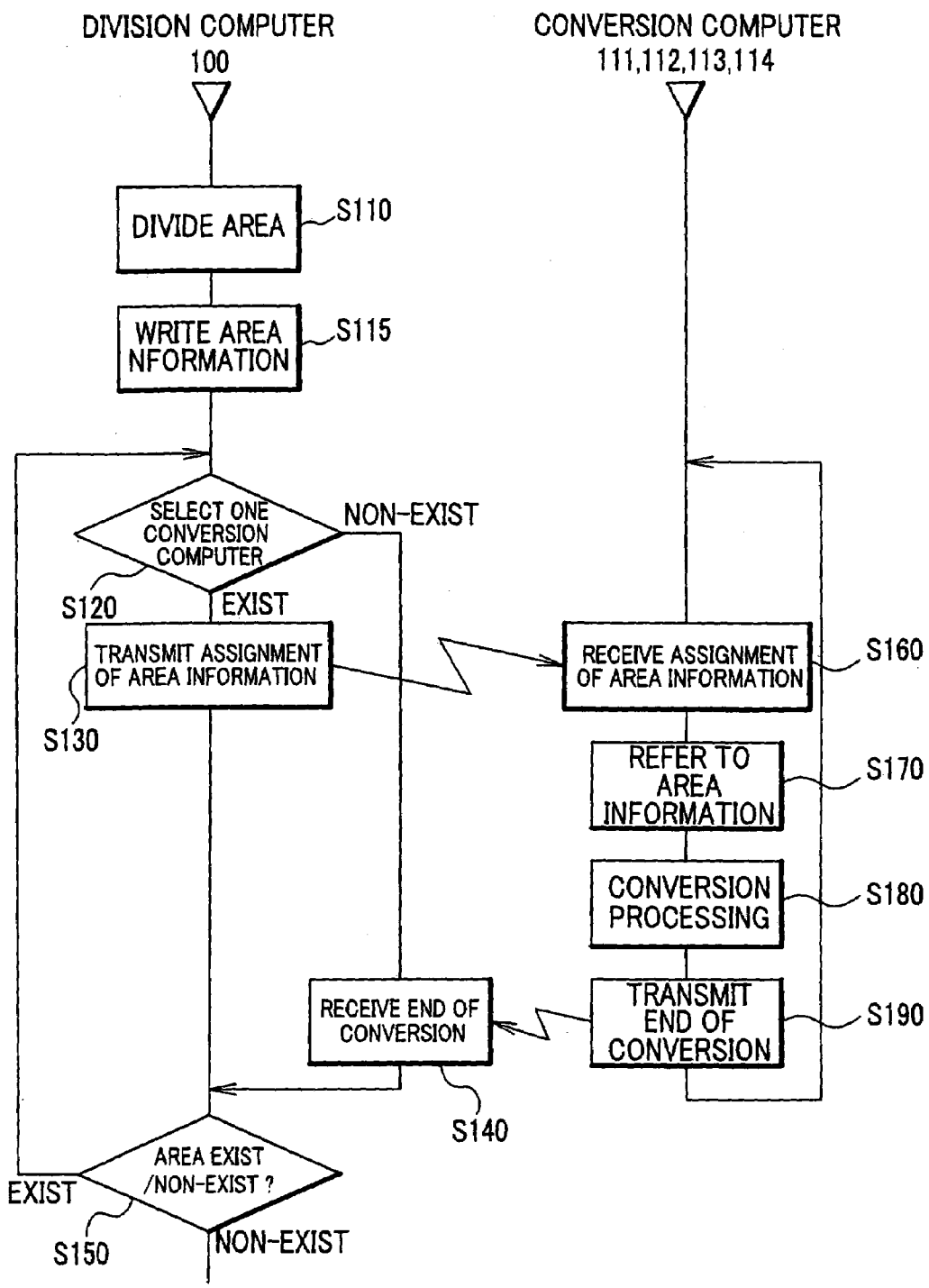
FIG. 6 is a flow chart by which the area information shown in FIG. 5 is divided and processed.

FIG. 6 shows a process flow concerning the embodiment of FIG. 5.

The division computer 100 refers to the semiconductor production information 200 stored in the storage device 40 and divides it into arbitrary areas (S110). According to the arbitrary areas, the division computer 100 divides the semiconductor production information 200 into plurality pieces of area information 202, 204, 206, 208, and stores them in the storage device 40 (S115). In this preferred embodiment, the semiconductor production information 200 is divided into four pieces, however, the number of information pieces is not limited. The division computer 100 selects one of the conversion computers 111, 112, 113, 114 on condition that it can execute the process (S120). The division computer 100 communicates with the selected conversion computer 110 to assign any of the area information 202, 204, 206, 208 (S130). After a confirmation whether or not an unprocessed divided area remains (S150), operation is completed if all the areas are processed. If an unprocessed area remains, then operation returns to S120. If there is no conversion computer left which can execute the process, then operation is suspended to stand by for the arrival of an end message from the conversion computers 111, 112, 113, 114 (S140). Meanwhile, the conversion computer 111, 112, 113, 114 receives a command for assigning arbitrary area information (S160). Based on the area information, the conversion computer 110 refers to at least one piece of design information 202, 204, 206, 208 divided and stored in the storage device 40 (S170). Information referred to is then converted (S180) When the process is completed, the conversion computer 110 transmits the message indicating the end of process to the division computer 100 (S190).

Figure 7:
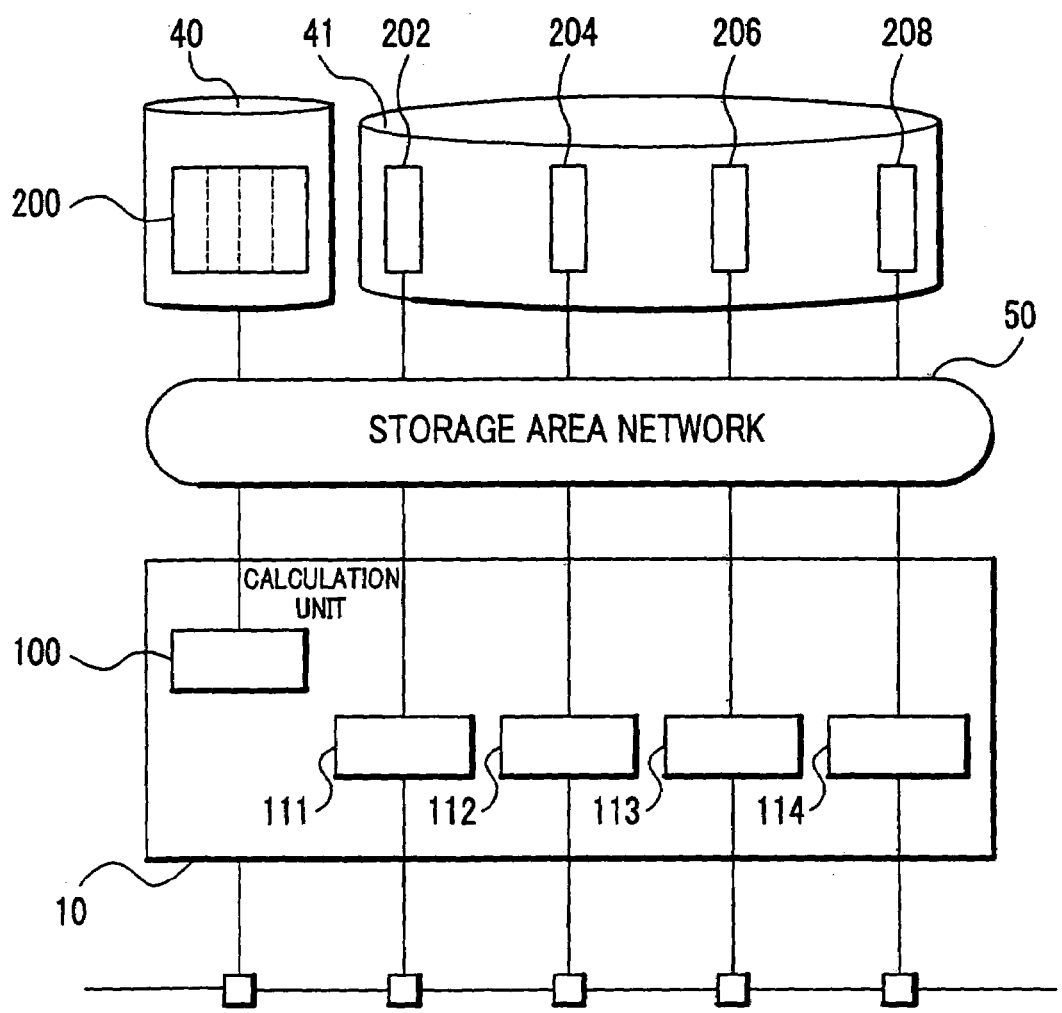
FIG. 7 is a block diagram illustrating a configuration by which area information is divided and stored in another storage device.

FIG. 7 shows one example in which the division computer 100 divides the semiconductor production information 200 into a plurality of areas, and stores them in a storage device 41 that is different from the storage device 40 for storing the semiconductor production information 200. In this preferred embodiment, the conversion computer 110 consists of four conversion computers 111, 112, 113, 114, however, the number of the conversion computers is not limited to four computers. In this embodiment, because the division computer 100 and the plurality of conversion computers 111, 112, 113, 114 can share the semiconductor production information 200 stored in the storage device 40 through the storage area network 50 and the storage device 41 is further provided, without affecting the process of the conversion computer 110 it is possible to manipulate the semiconductor production information 200 after completing the process of the division computer 100. Such a configuration can alleviate a load of the storage device 40 and avoid contention of access at the storage device 41, which improves the parallel processing performance of the division computer 100 and the conversion computers 111, 112, 113, 114. Further, when the process of the division computer 100 is completed, the semiconductor production information 200 is unnecessary and can be deleted. Therefore, it is possible to store new semiconductor production information 200 in the storage device 40. Accordingly, the storage device 40 is utilized effectively because the semiconductor production information can be deleted at the time of completing the process of the division computer 100 and design information for the next process can be stored in the storage device 40.

Figure 8:
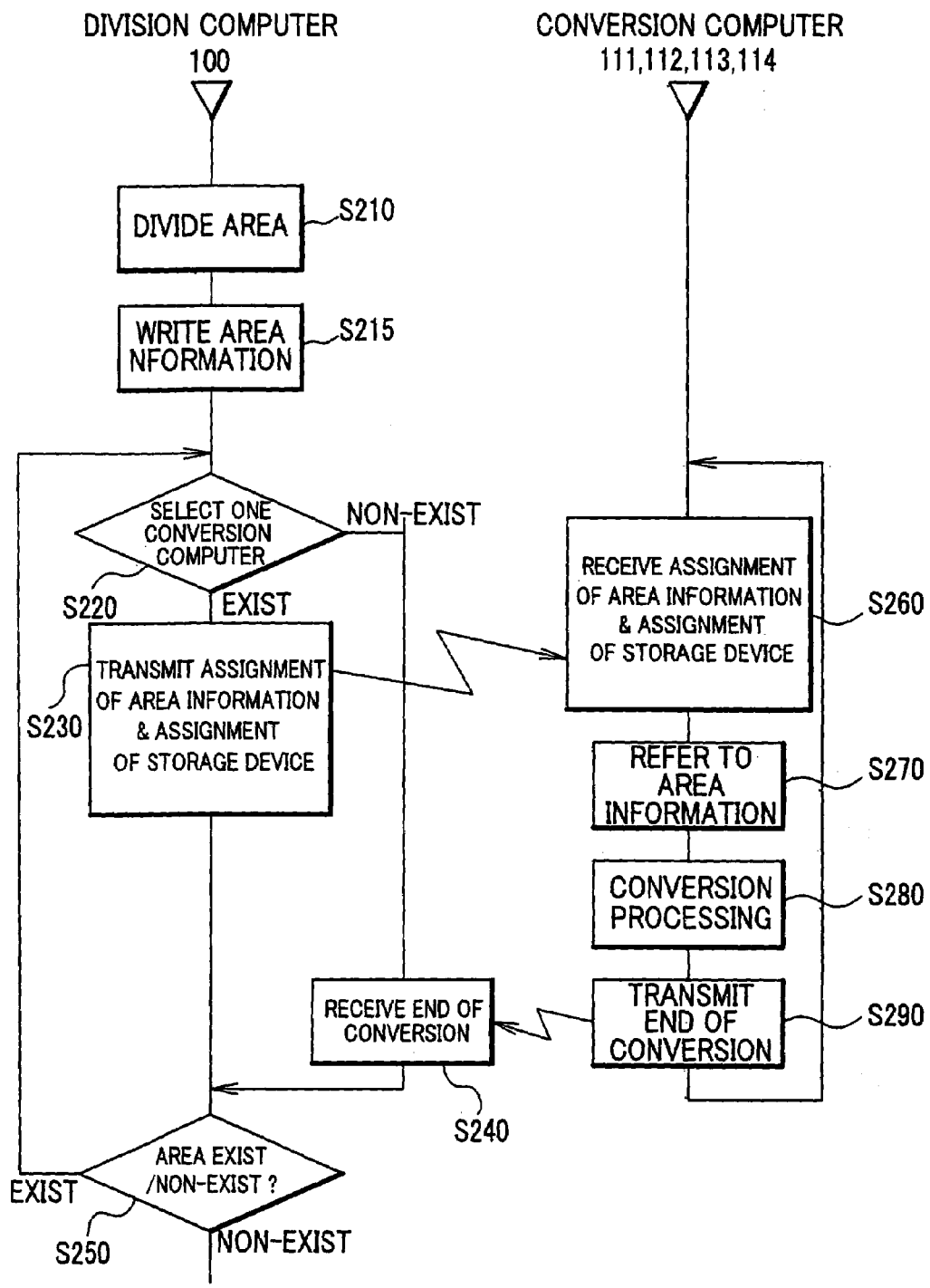
FIG. 8 is a flow chart by which the area information shown in FIG. 7 is divided and processed.

FIG. 8 shows a process flow concerning the embodiment of FIG. 7.

Figure 9:
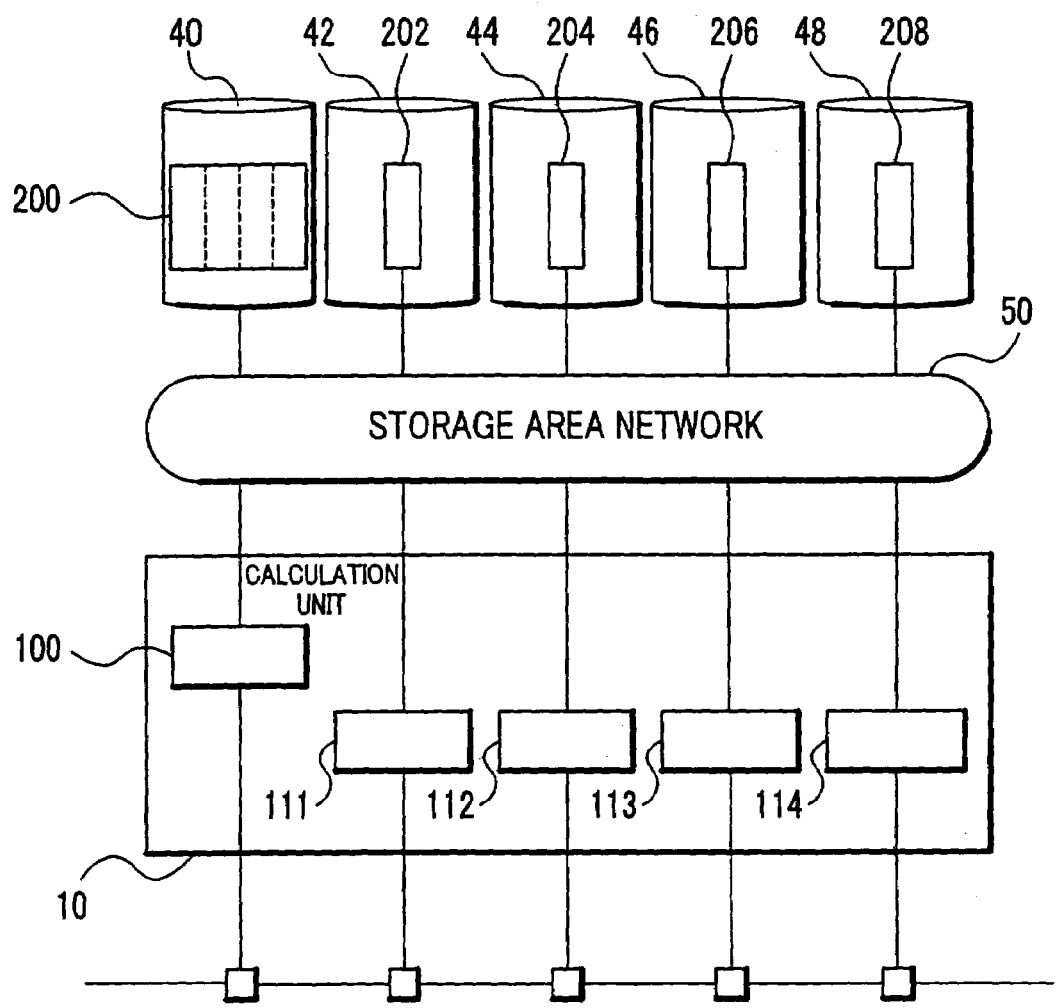
FIG. 9 is a block diagram illustrating a configuration by which area information is divided and stored in different storage devices.

The division computer 100 refers to the semiconductor production information 200 stored in the storage device 40 and divides it into arbitrary areas (S210). According to the arbitrary areas, the division computer 100 divides the semiconductor production information 200 into plurality pieces of area information 202, 204, 206, 208, and stores them in the storage device 40 (S215). In this preferred embodiment, the semiconductor production information 200 is divided into four pieces, however, the number of information pieces is not limited. The division computer 100 selects one of the conversion computers 111, 112, 113, 114 on condition that it can execute the process (S220). The division computer 100 communicates with the selected conversion computer 110 to assign any of the area information 202, 204, 206, 208 as well as to assign the storage device 41 (S230). After a confirmation whether or not an unprocessed divided area remains (S250), operation is completed if all the areas are processed. If an unprocessed area remains, then operation returns to S220. If there is no conversion computers left which can execute the process, then operation is suspended to stand by for the arrival of an end message from the conversion computers 111, 112, 113, 114 (S240). Meanwhile, the conversion computer 111, 112, 113, 114 receives a command for assigning arbitrary area information (S260). Based on the area information, the conversion computer 110 refers to at least one piece of design information 202, 204, 206, 208 divided and stored in the storage device 41 (S270). Information referred to is then converted (S280). When the process is completed, the conversion computer 110 transmits the message indicating the end of process to the division computer 100 (S290) FIG. 9 shows one example in which the division computer 100 divides the semiconductor production information 200 into a plurality of areas 202, 204, 206, 208 and stores them in storage devices 42, 44, 46, 48 respectively corresponding to the conversion computers 111, 112, 113, 114. In this preferred embodiment, the conversion computer 110 consists of four conversion computers 111, 112, 113, 114, however, the number of the conversion computers is not limited to four computers. In this embodiment, because the division computer 100 and the plurality of conversion computers 111, 112, 113, 114 can share the semiconductor production information 200 stored in the storage device 40 through the storage area network 50 and the storage devices 42, 44, 46, 48 are further provided, it is possible to manipulate the semiconductor production information 200 after completing the process of the division computer 100 without affecting the process of the conversion computer 110. Further, because the access of the conversion computers 111, 112, 113, 114 to the divided pieces of semiconductor design information 202, 204, 206, 208 can be separated, it is possible to improve the access performance of the conversion computers 111, 112, 113, 114, which substantially leads to improved conversion process performance.

Figure 10:
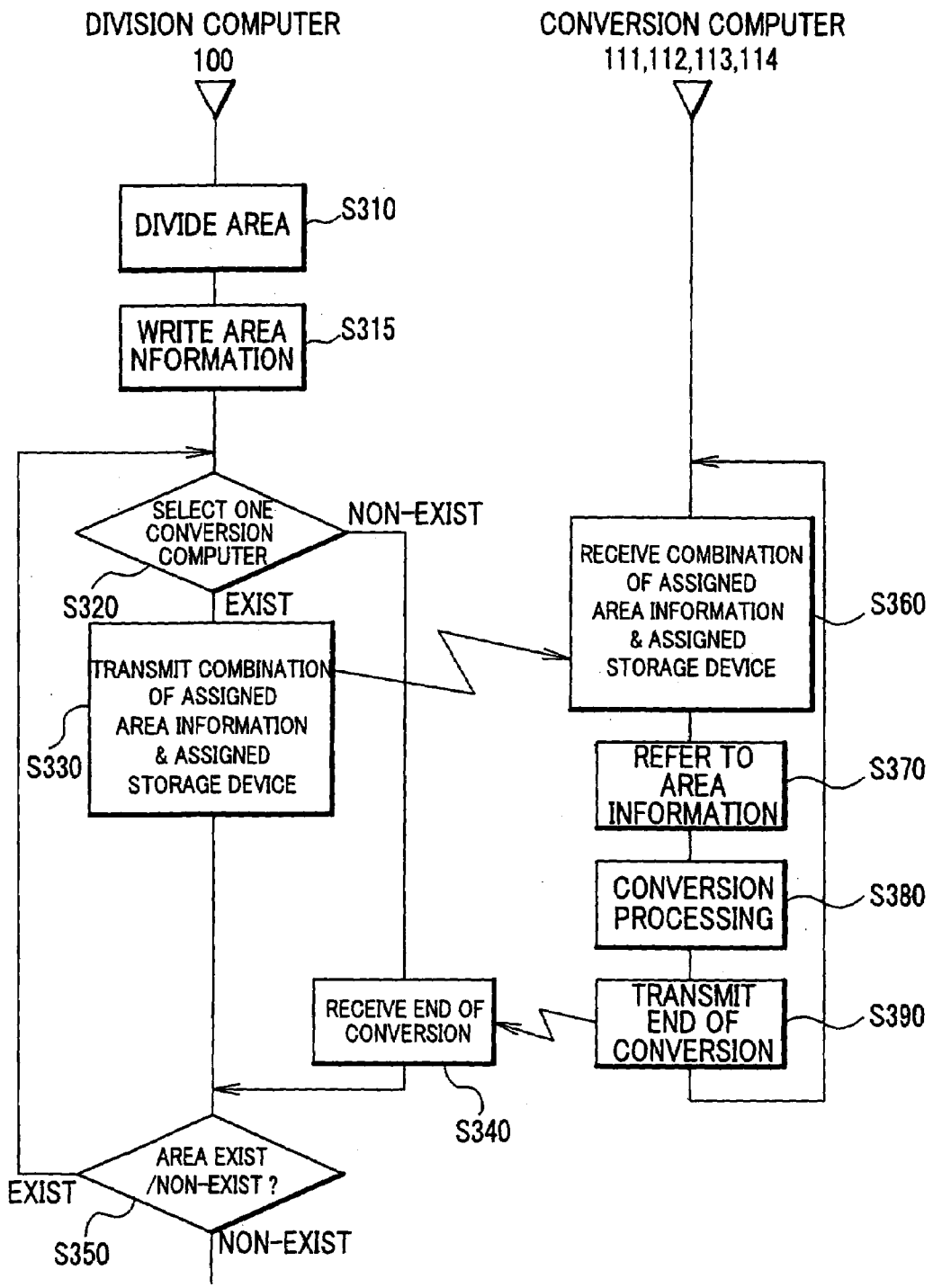
FIG. 10 is a flow chart by which the area information shown in FIG. 9 is divided and processed.

FIG. 10 shows a process flow concerning the embodiment of FIG. 9. The division computer 100 refers to the semiconductor production information 200 stored in the storage device 40 and divides it into arbitrary areas (S310). According to the arbitrary areas, the division computer 100 divides the semiconductor production information 200 into plurality pieces of area information 202, 204, 206, 208, and stores them in the storage devices 42, 44, 46, 48, respectively (S315). In this preferred embodiment, the semiconductor production information 200 is divided into four pieces, however, the number of information pieces is not limited. The division computer 100 selects one of the conversion computers 111, 112, 113, 114 on condition that it can execute the process (S320). The division computer 100 communicates with the selected conversion computer 110 to assign any one of the combinations between the area information 202, 204, 206, 208 and the storage device 42, 44, 46, 48 (S330). After a confirmation whether or not an unprocessed divided area remains (S350), operation is completed if all the areas are processed. If an unprocessed area remains, then operation returns to S320. If there is no conversion computers left which can execute the process, then operation is suspended to stand by for the arrival of an end message from the conversion computers 111, 112, 113, 114 (S340). Meanwhile, the conversion computer 111, 112, 113, 114 receives a command for assigning arbitrary area information and a command for assigning the storage device (S360). Based on the assignment of the area information and the storage device, the conversion computer 110 refers to at least one piece of design information 202, 204, 206, 208 divided and respectively stored in the storage devices 42, 44, 46, 48 (S370). Information referred to is then converted (S380). When the process is completed, the conversion computer 110 transmits the message indicating the end of the process to the division computer 100 (S390).

Figure 11:
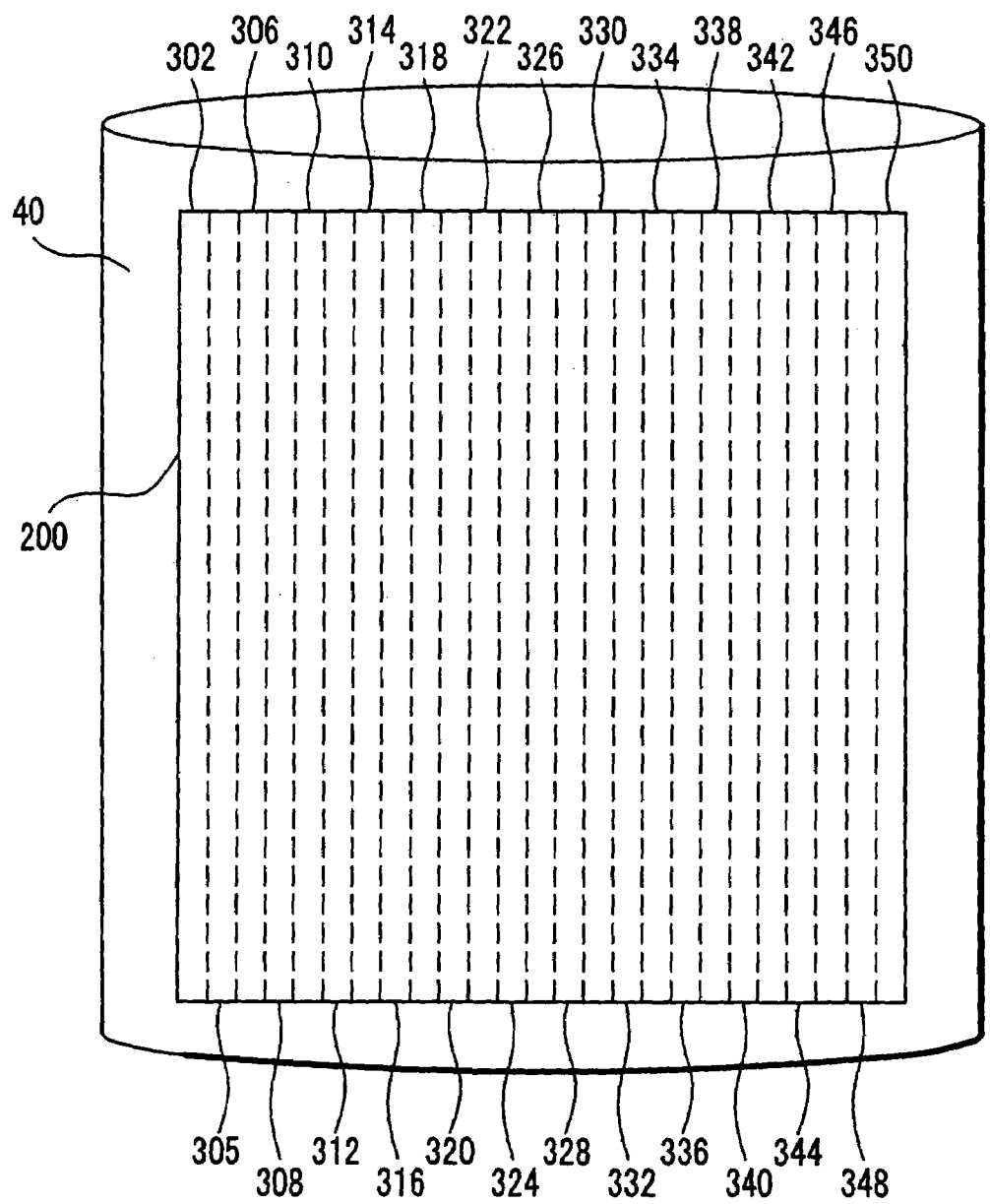
FIG. 11 shows an example in which design information is divided into strip-shaped pieces.

FIG. 11 shows an example in which the semiconductor production information 200 stored in the storage device 40 is divided into strip-shaped pieces. Strip-shaped stripe information 302 to 350 is determined such that the divided width in X-axis has an area width which allows electron beam radiation, such as of several hundreds micrometers, and the length in Y-axis has a range which allows movement of the stage, such as of several hundreds millimeters. Accordingly, the stripe information becomes appropriate for radiation of an electron beam with the stage continuously moved. This can improve the access efficiency for accessing the stripe information.

Figure 12:
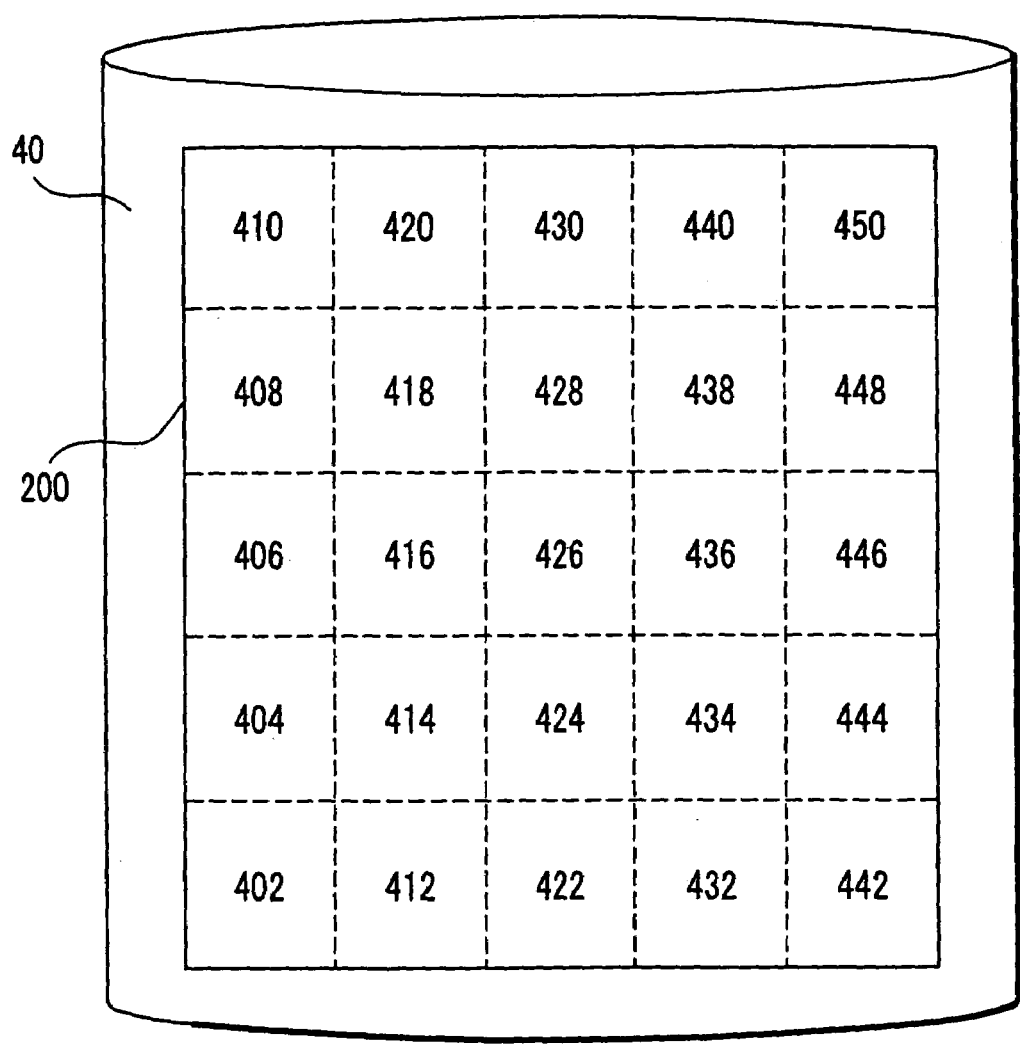
FIG. 12 shows an example in which design information is divided into mesh-shaped pieces.

FIG. 12 shows an example in which the semiconductor production information 200 stored in the storage device 40 is divided into mesh-shaped pieces. Mesh-shaped divided information 402 to 450 has a fixed value of 1 mm for both width and height. Because the size of one divided piece of design information becomes smaller when compared with the strip-shaped piece shown in FIG. 11, it is possible to alleviate the process load of the conversion computer 110. Further, with decreased number of divisions in Y-axis, semiconductor parts stored in the semiconductor production information 200 are less likely to be divided. This can improve the accuracy of the entire electron beam lithography.

Figure 13:
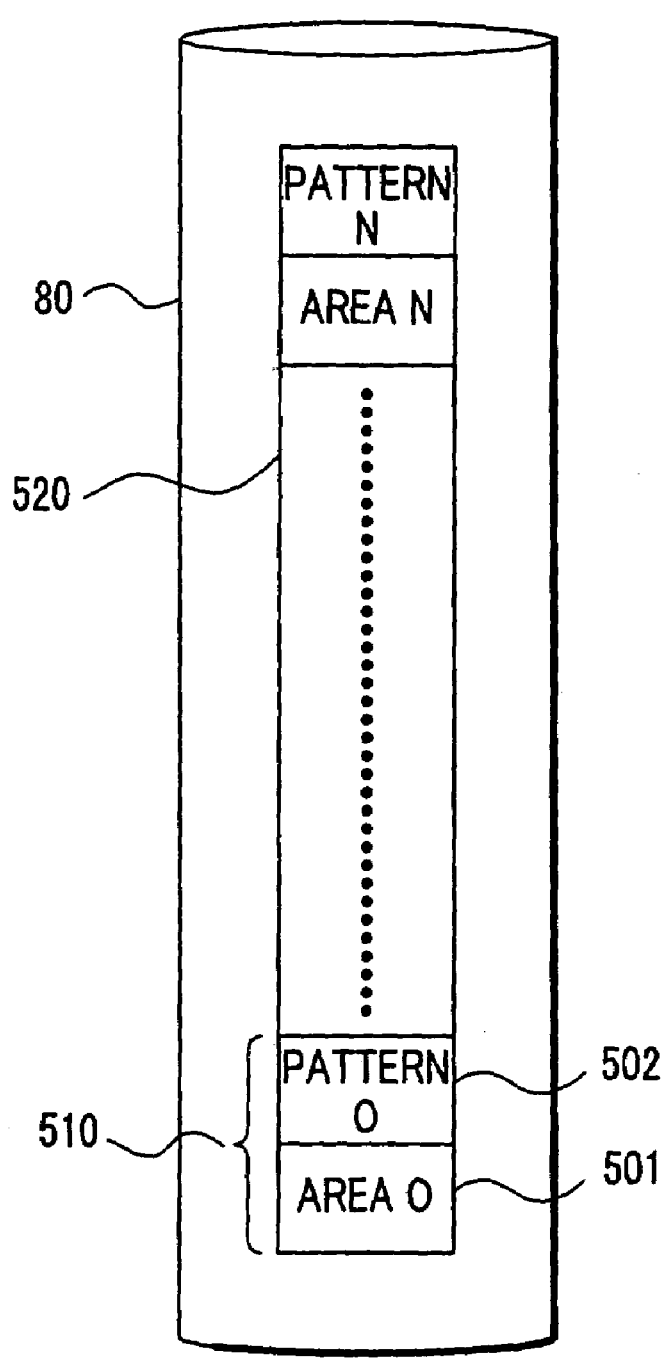
FIG. 13 shows an example in which a stripe writing information is stored as a pair of area information and pattern information included in the area.

FIG. 13 shows one example of stripe writing information 520, wherein the divided semiconductor production information 200 shown in FIG. 11 or FIG. 12 is processed by the conversion computer 110 and the results are stored in order of logic address of the storage device 80 as fine writing information 510 which consists of a pair of area information 501 and pattern information 502 presented in the area that is shown by the area information 501, such that the fine writing information 510 enables electron beam radiation to be effectively executed along its radiation locus. The logic address corresponds, for example, to LBA (Logical Block Address) of SCSI disk drive. The stripe writing information 520 is associated with the respective areas 302 to 350 of FIG. 11 each divided in strip-shape. Also, the stripe writing information 520 is associated with an arbitrary pair of divided mesh-shaped areas 402 to 450 shown in FIG. 12, that is, for example, divided areas 402, 404, 406, 408, 410 combined in the Y-axis direction.

As described above, because the area information 501 and the pattern information 502 presented in the area shown by the area information 501 are continuously stored in order of logic address of the storage device 80, performance of the storage device will be improved due to continuous readout. Further, the writing performance will be improved in terms of step and repeat method such that the stage is moved per fine writing information 510 to execute the writing.

Figure 14:
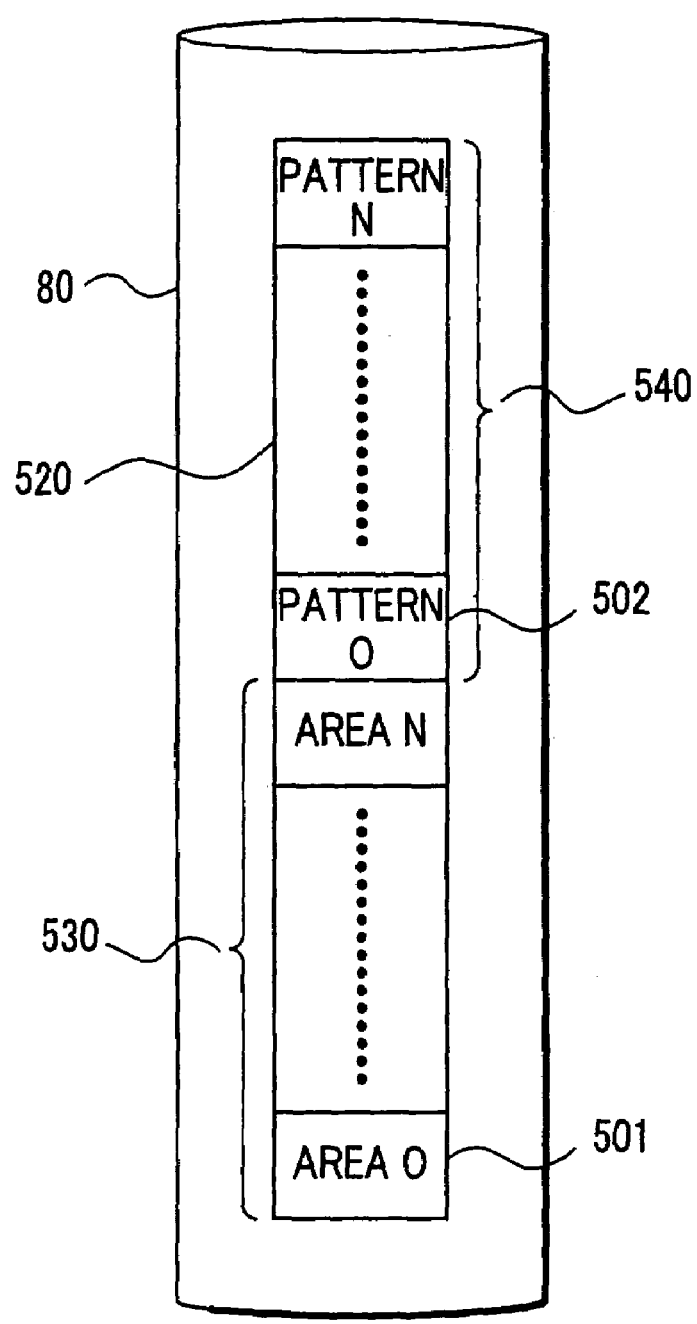
FIG. 14 shows an example in which stripe writing information is stored as a group of area information and a group of pattern information.

FIG. 14 shows one example in which the divided semiconductor production information 200 shown in FIG. 11 or FIG. 12 is processed by the conversion computer 110 and the results are stored in order of logic address of the storage device 80 as area group information 530 and a pattern information group 540. The area group information 530 is arranged in order such that area information 501 enables electron beam radiation to be effectively executed along the radiation locus. The pattern information group 540 is arranged such that the pattern information 502 presented in the area that is shown by the area information 501 is put in order in a manner corresponding to the arrangement of the area group information 530. The stripe writing information 520 is associated with the respective areas 302 to 350 each divided in strip-shaped. Also, the stripe writing information 520 is associated with an arbitrary pair of divided mesh-shaped areas 402 to 450 shown in FIG. 12, that is, for example, divided areas 402, 404, 406, 408, 410 combined in the Y-axis direction.

As described above, because the area information 501 and the pattern information 502 presented in the area shown by the area information 501 are continuously stored in order of logic address of the storage device 80, readout performance of the storage device will be improved due to continuous readout. Further, because the area group information 530 is read out prior to the pattern information group 540, the traveling speed of the stage can be optimized. Therefore, it is possible to improve the continuous writing performance for continuously moving the stage and continuously deflecting the electron beam lithography.

Figure 15:
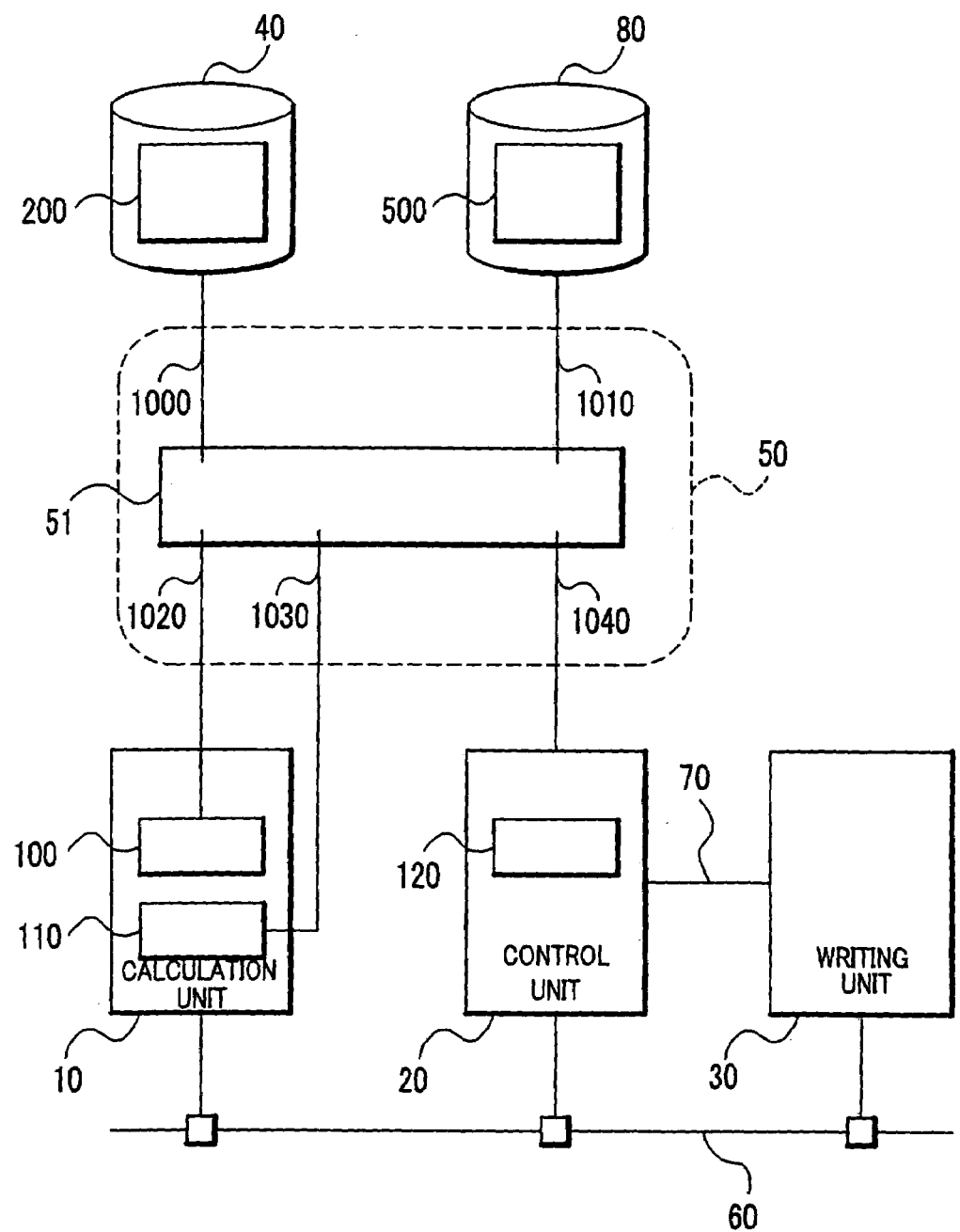
FIG. 15 shows an example in which a storage area network according to the present invention is configured by a fabric.

FIG. 15 shows a semiconductor manufacturing apparatus in which the storage area network 50 employs a topology using a switch 51. The calculation unit 10 includes at lease one division computer 100 which executes a process for dividing the semiconductor production information into arbitrary areas, and at least one conversion computer 110 which processes the semiconductor production information that is divided into arbitrary areas. The control unit 20 includes at least one control computer 120.

The storage device 40 for storing the semiconductor production information 200 is interconnected with a switch 51 through a communication pass 1000, and the storage device 80 for storing the stripe writing information group 500 is interconnected with the switch 51 through a communication pass 1010. The division computer 100, the conversion computer 110, and the control computer 120 are interconnected with the switch 51, respectively through a communication pass 1020, a communication pass 1030, and a communication pass 1040. The storage area network 50 is configured accordingly.

Figure 16:
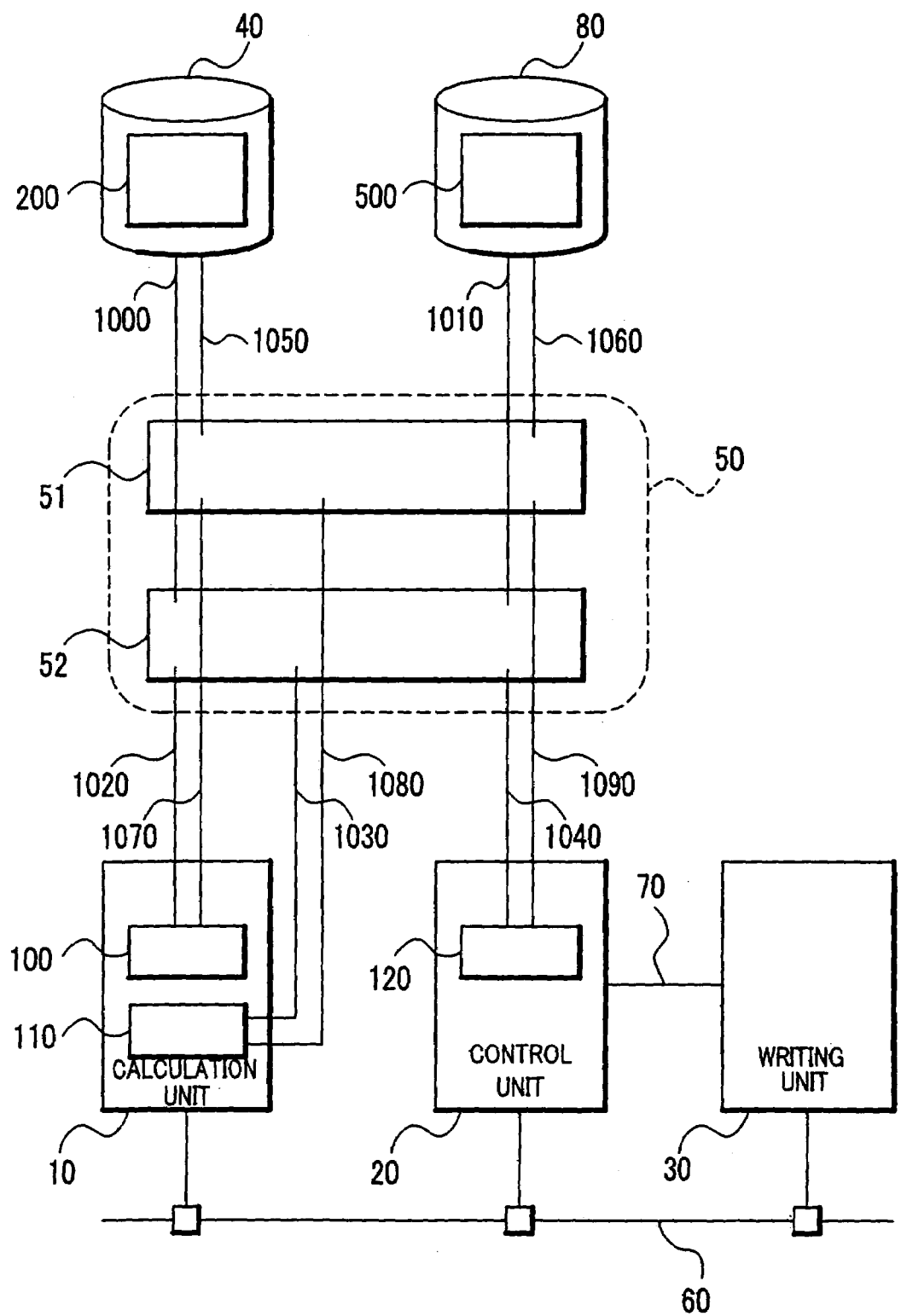
FIG. 16 shows an example in which communication paths and communication equipment are duplicated.

FIG. 16 shows a semiconductor manufacturing apparatus in which the storage area network 50 employs a topology using switches and communication passes are duplicated for the purposes of expanding the communication band and avoiding failure. The calculation unit 10 includes at least one division computer 100 which executes a process for dividing the semiconductor production information into arbitrary areas, and at least one conversion computer 110 which processes the semiconductor production information that is divided into arbitrary areas. The control unit 20 includes at least one control computer 120.

The storage device 40 for storing the semiconductor production information 200 is interconnected with switches 51, 52 through communication passes 1000, 1050, and the storage device 80 for storing the stripe writing information group 500 is interconnected with the switches 51, 52 through communication passes 1010, 1060. The division computer 100, the conversion,computer 110, and the control computer 120 are interconnected with the switches 51, 52, respectively through communication passes 1020, 1070, communication passes 1030, 1080, and communication passes 1040, 1090. The storage area network 50 duplicated and having redundancy is configured accordingly.

Figure 17:
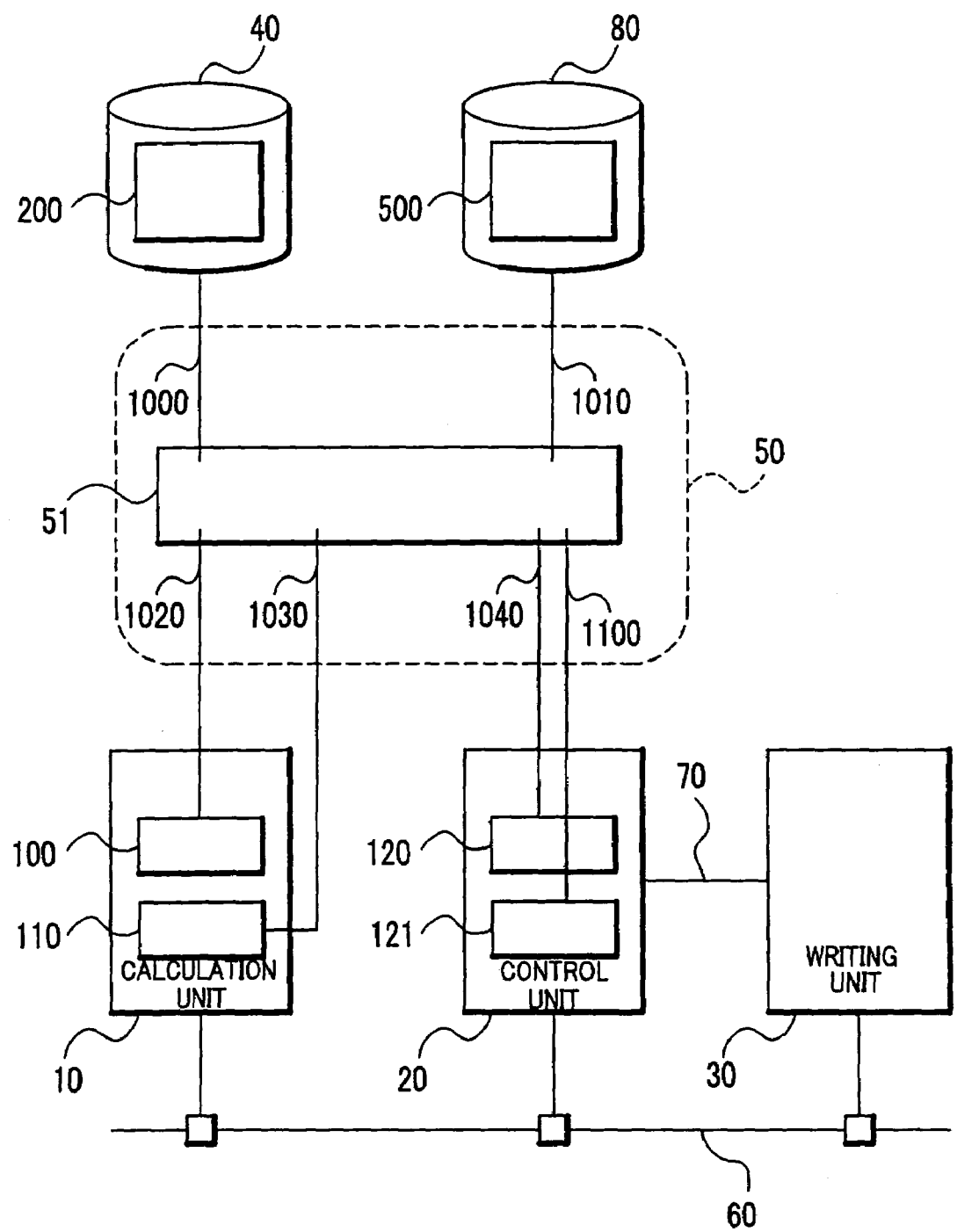
FIG. 17 shows an example in which the control unit is duplicated.

FIG. 17 shows an example in which the control unit 20 is duplicated at the control computers 120, 121 so as to access the aggregate of the stripe writing information of FIGS. 11 and 12 stored in the storage device 80. With this configuration, the control unit 20 does not have to wait the processing time of the writing unit 30. The calculation unit 10 includes at least one division computer 100 which execute a process for dividing the semiconductor production information into arbitrary areas, and at least one conversion computer 110 which processes the semiconductor production information that is divided into arbitrary areas. The control unit 20 includes control computers 120, 121. The storage device 40 for storing the semiconductor production information 200 is interconnected with a switch 51 through a communication pass 1000, and the storage device 80 for storing the stripe writing information 500 is interconnected with the switch 51 through a communication pass 1010. The division computer 100, the conversion computer 110, the control computer 120, and the control computer 121 are interconnected with the switch 51, respectively through a communication pass 1020, a communication pass 1030, a communication pass 1040, and a communication pass 1100. The storage area network 50 is configured accordingly. The control computer 120 accesses the storage device 80 through the communication pass 1040, the switch 51, and the communication pass 1010, and then processes writing information that is associated with one stripe of the stripe writing information group 500 stored in the storage device 80. The processing result is transferred to the writing unit 30 through the communication pass 70 to perform writing. During the time the control computer 120 executes the processing and the writing unit 30 executes electron beam lithography, the control computer 121 can process writing information associated with the next stripe. Similar to the control computer 120, the control computer 121 accesses the storage device 80 through the communication pass.1100, the switch 51, and the communication pass 1010, and then processes unprocessed stripe writing information group 500 stored in the storage device 80. As describe above, the control computer 120 and the control computer 121 alternately execute the process in advance of the other, which improves the performance of the entire apparatus.

Figure 18:
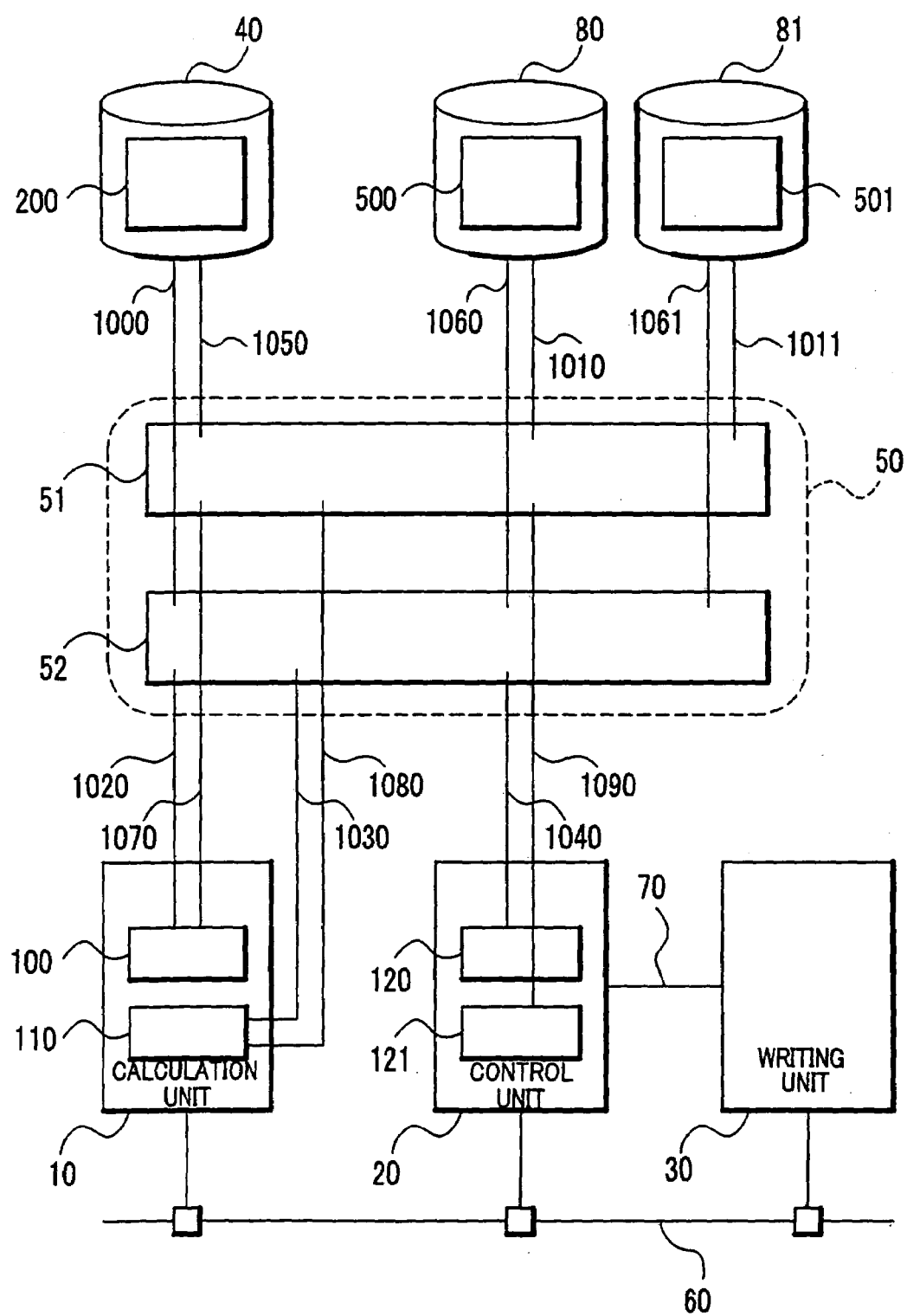
FIG. 18 shows an example in which communication paths, communication equipment, and the control unit are duplicated.

FIG. 18 shows an example in which the storage devices are duplicated for the purposes of avoiding contention of access at the storage device 80 shown in FIGS. 16 and 17 and improving the throughput. The calculation unit 10 includes at least one division computer 100 which executes a process for dividing the semiconductor production information into arbitrary areas, and at least one conversion computer 110 which processes the semiconductor production information that is divided into arbitrary areas. The control unit 20 includes two control computers 120, 121. The storage device 40 for storing the semiconductor production information 200 is interconnected with switches 51, 52 trough communication passes 1000, 1050. The storage device 80 for storing the stripe writing information group 500 is interconnected with the switches 51, 52 through communication passes 1010, 1060. The storage device 81 for storing the stripe processing results 501 is interconnected with the switches 51, 52 through communication passes 1011, 1061. The division computer 100, the conversion computer 110, the control computer 120, and the control computer 121 are interconnected with the switches 51, 52, respectively through communication passes 1020, 1070, communication passes 1030, 1080, communication passes 1040,1090, and a communication pass 1090. The storage area network 50 duplicated and having redundancy is configured accordingly.

For example, in a case where the storage device 80 is associated with the control computer 120 and the storage device 81 is associated with the control computer 121, the conversion computer 110 stores the processing results in the storage device 80 through the communication pass 1080, the switch 51, and the communication pass 1010, while the control computer 120 can read out the stripe processing results 500 from the storage device 80 through the communication pass 1040, the switch 52, and the communication pass 1060. Also, the conversion computer 110 stores the processing results in the storage device 81 through the communication pass 1030, the switch 52, and the communication pass 1061, while the control computer 121 can read out the stripe processing results 501 from the storage device 81 through the communication pass 1090, the switch 51, and the communication pass 1011.

As described above, the storage operation of the conversion computer 110 to the storage device 80, the access of the control computer 120 to the storage device 80, the storage operation of the conversion computer 110 to the storage device 81, and the access of the control computer 121 to the storage device 81 can be performed through different access passages. Therefore, the contention of access at the storage devices 80, 81 and the control computers 120, 121 can be avoided, and the performance of the entire system can be improved.

Figure 19:
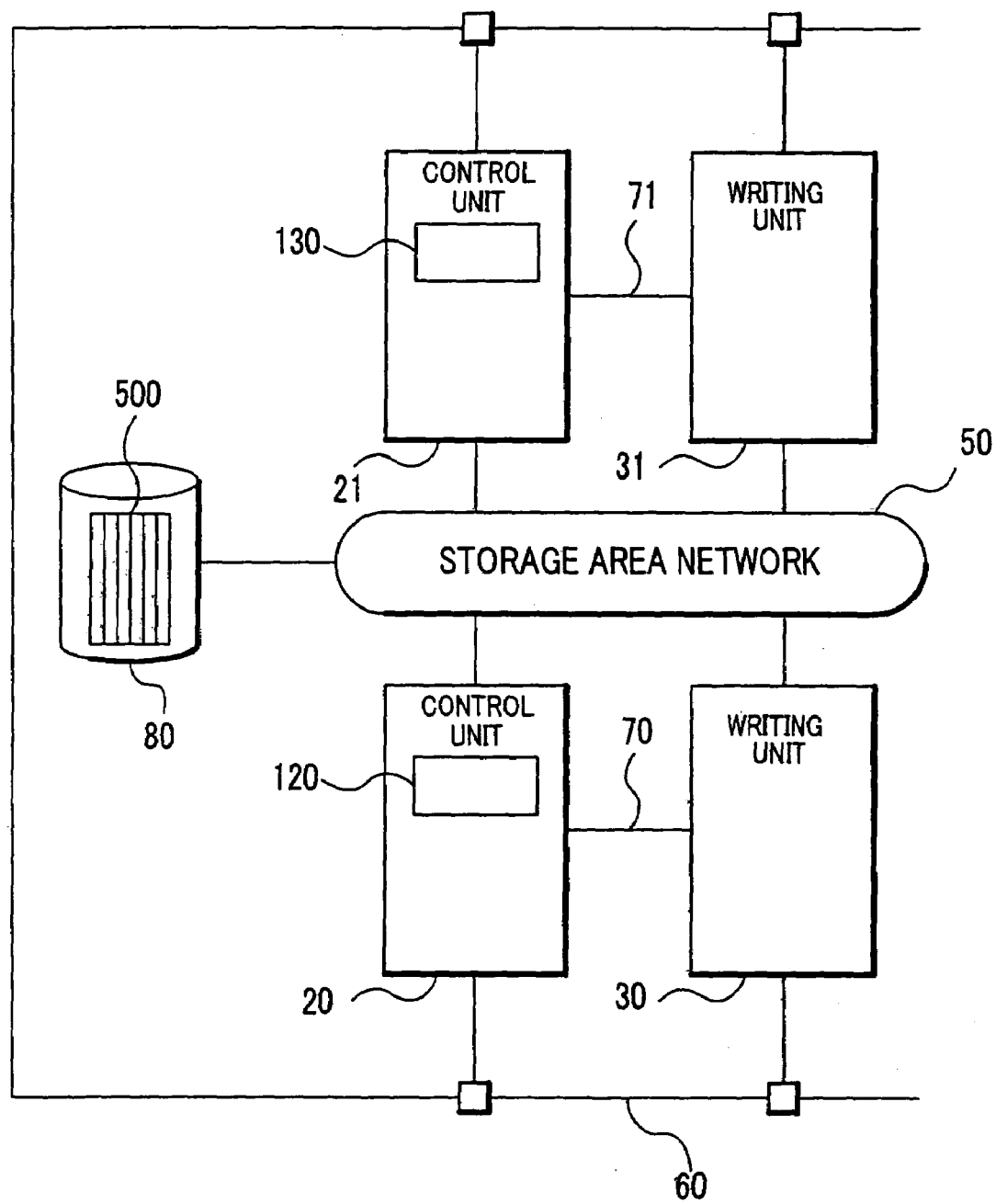
FIG. 19 is a block diagram illustrating one example of a cluster configuration of a semiconductor manufacturing apparatus according to the present invention.

FIG. 19 shows an example in which a configuration downstream of the storage device 80 is multiplexed. The storage device 80 for storing the stripe writing information group 500 is interconnected with the storage area network 50. The control unit 20 includes at least one computer 120, and is interconnected with the writing unit 30 through a communication pass 70. The control unit 21 includes at least one computer 130, and is interconnected with the writing unit 31 through a communication pass 71. The control unit 20, the writing unit 30, the control unit 21, and the writing unit 31 are interconnected with the storage area network 50, through which they can access the stripe writing information group 500. With this configuration, plurality combinations of the control unit and the writing unit are interconnected with the storage area network 50, which leads to decreased writing time with respect to the same stripe writing information group 500. With the combination of a multiplexed system as shown in FIG. 18 in which computers corresponding to the storage device 81 and the control computer 121 are added, speeding up of the processing and decreased writing time can be achieved.

Figure 20:
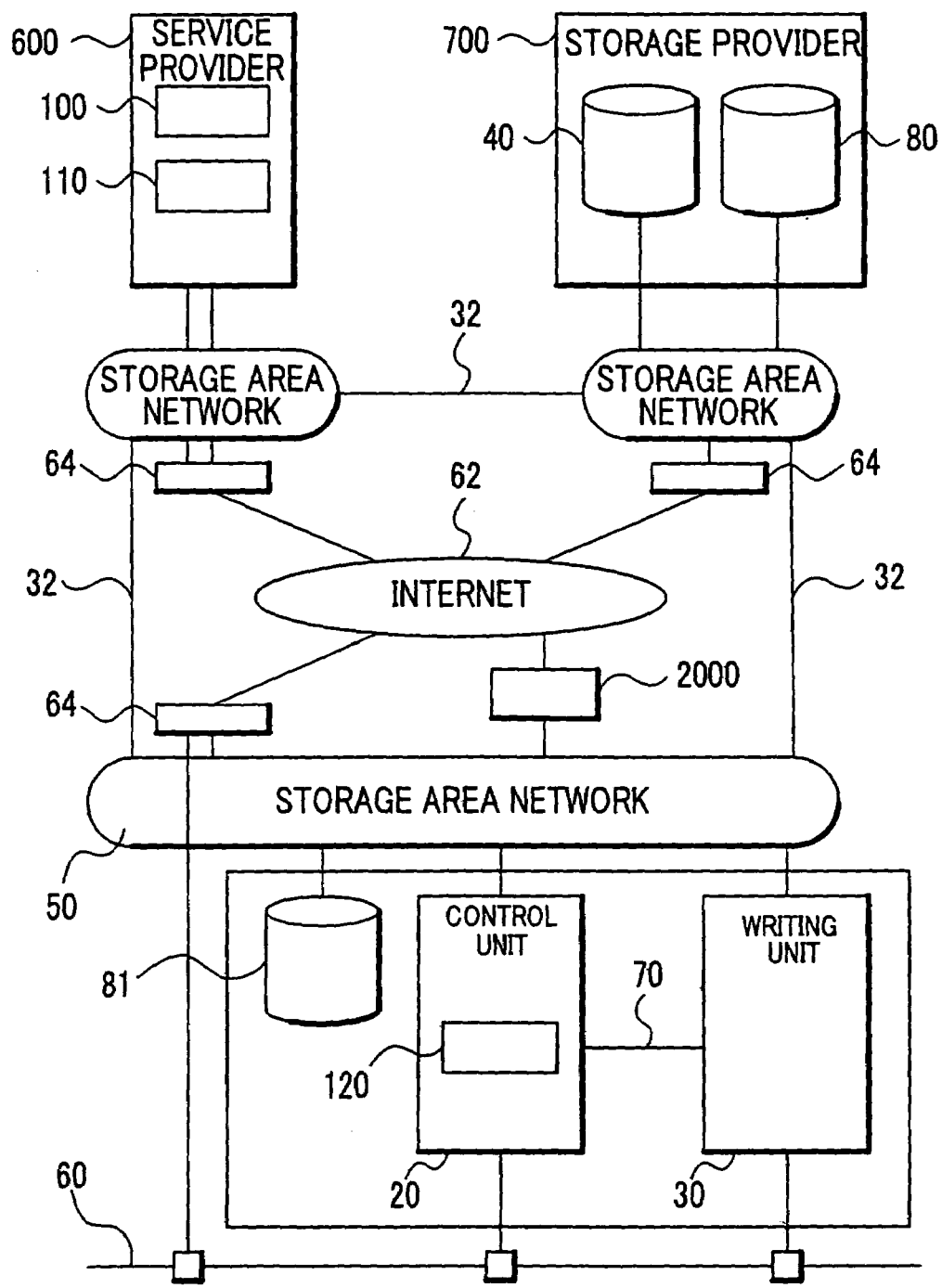
FIG. 20 is a block diagram illustrating one example of a semiconductor manufacturing apparatus interconnected with a service provider and a storage provider.

FIG. 20 shows a configuration in which the division computer 100 and the conversion computer 110 of the calculation unit 10 are computers of a service provider 600 whose business is to offer lease and management of computers, and the storage device 40 for storing the semiconductor production information and the storage devices 80, 81 for storing the stripe writing information are storage devices of a storage provider 700 whose business is to offer lease and management of storage devices, and in which the division computer 4100, the conversion computer 110, and the storage devices 40, 80, 81 are interconnected with the control unit 20 and the writing unit 30 through a plurality of passages, such as the Internet 62 or communication pass 32 such as an exclusive line, via a router or bridge 64. The storage device 81 is for backing up the storage device 80, and is also used for storing local copies of the storage device 80 and the storage device 40 that is provided in case the communication band of the communication pass 32 is narrow, and frequently-used information. With this configuration, only the control unit 20 and the writing unit 30 of the semiconductor manufacturing apparatus can be installed in a semiconductor manufacturing site. Therefore, it is possible to decrease the install space within the clean room. A semiconductor manufacturing apparatus user 2000 as a client of the apparatus or a client 2000 of the semiconductor manufacturing apparatus user accesses the Internet 62 or the storage area network 50, so that they can use the computers of the service provider 600, the storage devices of the storage provider 700, the control unit 20, and the writing unit 30. In a case where the client 2000 is a logic design maker, mask layout data as a kind of semiconductor design data can be shared through the storage area network 50, 32 or the Internet 62, which allows unify management and unify storage of the mask layout data. Unlike the conventional configuration, it does not require time-consuming transmission/reception of the semiconductor production information 200 between the client and the apparatus user, and they do not have to possess a storage device with a storage capacity corresponding to the semiconductor production information 200.

Because the semiconductor manufacturing apparatus substantially consist of the control unit 20 and the writing unit 30, by utilizing facilities of the service provider 600 and the storage provider 700, it is possible to improve the operating efficiency of the facilities with small investment.

Figure 21:
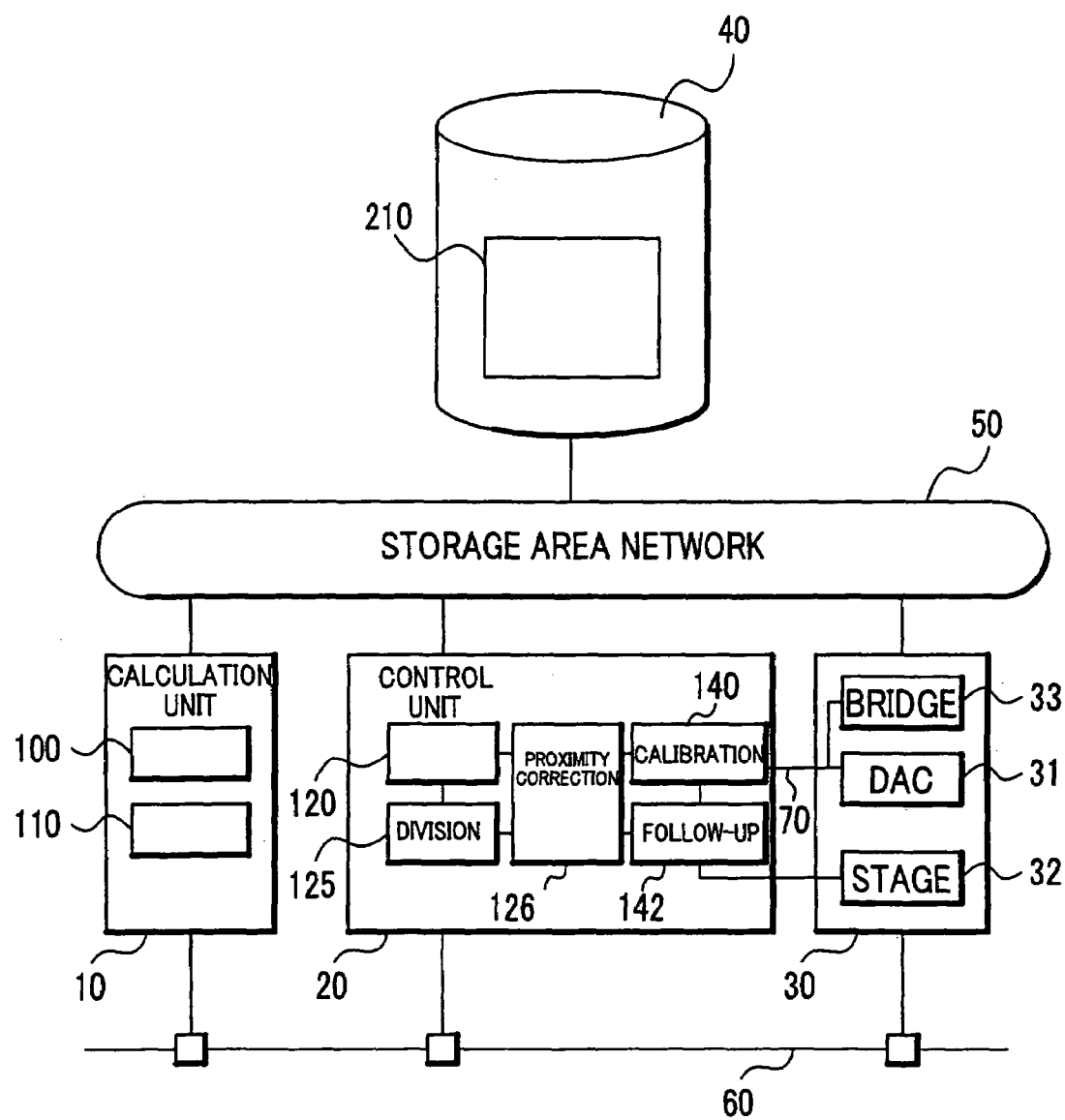
FIG. 21 is a block diagram illustrating one example of a semiconductor manufacturing apparatus which can store in-process results.

FIG. 21 shows an example in which the storage device stores shot information concerning electron beam radiation. The calculation unit 10 includes at least one division computer 100 and at least one conversion computer 110, and is interconnected with the storage area network 50 and the local area network 60. The control unit 20 includes at least one control computer 120, a division unit 125 which divides pattern information included in the stripe writing information into basic patterns to be written by electron beam, a proximity correction unit 126 which executes a proximity effect correction on the electron beam radiation, a calibration unit 140 which calibrates the position of the electron beam radiation and the like, and a follow-up unit 142 which follows up the movement of the stage 32 and exerts an influence on deflection of electron beam radiation. The control unit 20 is interconnected with the storage area network 50 and the local area network 60. The writing unit 30 includes DAC 31 which converts digital data transmitted through the writing data communication pass 70 into analog data and controls a beam deflector and the like, the stage 32 for moving a mask or a wafer, and a bridge 33 which converts digital data to be inputted into DAC 31 into protocol of the storage area network 50. The writing unit 30 is interconnected with the storage area network 50 and the local area network 60.

With this configuration, processing results at the division unit 125, the proximity correction unit 126, and the calibration unit 140 can be temporally stored in the storage device 40. This can allow the suspended process to be restarted based on the temporally stored results. Further, the shot information 210 for electron beam radiation is stored in the storage device 40 through the bridge 33. This allows an evaluation of the shot without actual writing even if DAC 31 is not operated, and when the writing is performed actually, it can help to investigate a cause of trouble at the time of writing the shot information 210 stored in the storage device 40.

As previously described with reference to various embodiments, the present invention provides a semiconductor manufacturing apparatus, which executes communication of a large volume of semiconductor design information (semiconductor production information) at high speed, and which stores the design information, and which further includes a network through which a plurality of devices can refer to the design information.

Also, the present invention provides a semiconductor manufacturing apparatus, which includes means for storing processing results after converting and correcting the semiconductor design information, and which allows to suspend and restart the writing process with the use of the stored processing results.

Further, the present invention provides a semiconductor manufacturing apparatus, which permits a storage format and arrangement of storage devices suitable for the method and the locus of electron beam radiation with respect to the movement of the stage and electron beam radiation permissible area.

Further, the present invention provides a semiconductor manufacturing apparatus, which allows computers and/or storage devices to be added and/or removed according to a requirement about processing performance and storage capacity without stopping the semiconductor manufacturing apparatus.

According to the present invention, with the provision of a communication pass for interconnecting a storage device, it is possible to improve the throughput of the entire apparatus and to unify the management of various data.

What is claimed is:

1. A semiconductor manufacturing apparatus comprising:
   a calculation unit including at least one computer for processing semiconductor design information;
   a control unit for controlling radiation of an electron in accordance with a processing result of the semiconductor design information;
   a writing unit for radiating an electron in accordance with instructions of the control unit; and
   at least one storage device,
   wherein the control unit has a division unit which divides pattern information included in the semiconductor design information into patterns to be written by an electron beam, and a proximity correction unit which executes a proximity effect correction on the radiation of the electron, and wherein the semiconductor manufacturing apparatus further includes a communication pass through which processing results at the division unit or the proximity correction unit are transmitted to the storage device.

2. A semiconductor manufacturing apparatus comprising:
   a calculation unit including at least one computer for processing semiconductor design information;
   a control unit for controlling radiation of an electromagnetic wave in accordance with a processing result of the semiconductor design information;
   a writing unit for radiating an electromagnetic wave in accordance with instructions of the control unit; and
   at least one storage device,
   wherein a communication is permissible between the storage device, the calculation unit, the control unit, and the writing unit, and wherein the semiconductor manufacturing apparatus further includes a communication pass through which the storage device can be controlled.

* * * * *